(12) United States Patent
Sakai et al.

(10) Patent No.: US 8,448,049 B2
(45) Date of Patent: May 21, 2013

(54) RECEIVING APPARATUS, RECEIVING METHOD, PROGRAM, AND RECEIVING SYSTEM

(75) Inventors: Lui Sakai, Kanagawa (JP); Takashi Yokokawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 310 days.

(21) Appl. No.: 12/783,883

(22) Filed: May 20, 2010

(65) Prior Publication Data

US 2010/0306627 A1 Dec. 2, 2010

(30) Foreign Application Priority Data

May 29, 2009 (JP) ................................ P2009-131256

(51) Int. Cl.
*H03M 13/00* (2006.01)
(52) U.S. Cl.
USPC ............................ 714/781; 714/752; 714/758
(58) Field of Classification Search
USPC .......................................... 714/752, 758, 781
See application file for complete search history.

(56) References Cited

U.S. PATENT DOCUMENTS

2008/0059862 A1   3/2008   Kyung et al.

FOREIGN PATENT DOCUMENTS

WO   WO 2004/047307   6/2004
WO   WO 2011/010286   1/2011

OTHER PUBLICATIONS

ETSI EN 302 755 V1.1.1, "Digital Video Broadcasting (DVB); Frame Structure Channel Coding and Modulation for a Second Generation Digital Terrestrial Television Broadcasting System (DVB-T2)", DVB Document A122, pp. 1-167, (2009).
Kim, Jung-Ae et al. "Analysis of Check-Node Merging Decoding for Punctured LDPC Codes with Dual-Diagnol Parity Structure", IEEE Wireless Communications and Networking Conference, 2007, IEEE Operations Center, Piscataway, NJ, Mar. 1, 2007, pp. 572-576.
European Search Report issued Sep. 12, 2011 in the Hague for corresponding European patent application No. EP 10 00 4801.
Moon, Mathematical Methods and Algorithms, Jun. 6, 2005, ISBN-10:0471648000;isbn-13:978-0471648000; Low-Density Parity-Check Codes, pp74-75, pp. 634-635 and pp. 638-639.
English -language Communication pursuant to Article 94 (3) EPC issued by the European Patent Office on Jun. 6, 2012 in European patent application No. EP 10 00 4801.6.

*Primary Examiner* — Sam Rizk
(74) *Attorney, Agent, or Firm* — Sherr & Jiang, PLLC

(57) ABSTRACT

Disclosed herein is a receiving apparatus including a reception device configured to receive a code sequence coded in LDPC (Low Density Parity Check) and punctured at least partially as a target to be decoded; and an LDPC decoding device configured to perform a punctured matrix transform process including a first and a second process on an original parity check matrix noted to have punctured bits or symbols and used in the LDPC coding. The LDPC decoding device further performs the first process to carry out Galois field addition operations on those rows of the original parity check matrix to set the non-zero elements to zero. The LDPC decoding device further performs the second process to delete the columns rid of the non-zero elements. The LDPC decoding device uses the matrix resulting from the process as the parity check matrix for performing an LDPC decoding process on the code sequence.

17 Claims, 27 Drawing Sheets

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG.10

| BLOCK NAME | OUTPUT SIGNAL | FUNCTIONS IN THE PRE-SIGNAL PROCESSING SECTION | FUNCTIONS IN THE POST-SIGNAL PROCESSING SECTION |
|---|---|---|---|
| PRE-SIGNAL/POST-SIGNAL GENERATION SECTION | K | K IS FIXED TO 168 BITS. | K IS DEPENDENT ON PARAMETERS. |
| CRC INSERTION PORTION | Ksig | A 32-BIT CRC IS ADDED TO FORM Ksig-BIT SIGNAL (Ksig=200 BITS AT ALL TIMES FOR PRE-SIGNAL). | |
| ZERO PADDING PORTION | Kbch | A 2872-BIT ZERO CODE IS INSERTED TO FORM SIGNAL Kbch=3072. | A 7032-Ksig BIT ZERO CODE IS INSERTED TO FORM SIGNAL Kbch=3072. |
| BCH ENCODER | Nbch | SIGNAL IS CODED IN BCH AND SUPPLEMENTED WITH 168 PARITY BITS TO FORM SIGNAL Nbch(PRE)=3240 OR Nbch(POST)=7200. | |
| LDPC ENCODER | Nldpc=16200 | SIGNAL IS CODED IN LDPC TO FORM SIGNAL Nldpc=16,200. CODE RATE (PRE)=1/4, CODE RATE (PST)=1/2 | |
| PUNCTURING/ZERO DELETION PORTION | N | DELETE INSERTED ZEROS TO PUNCTURE LDPC PARITY BITS. | |
| BIT INTERLEAVER | | NONE | BLOCK INTERLEAVE |
| DEMUX PORTION | Ncells | NONE | SAME DEMUX AS DATA |
| MAPPING PORTION | | BPSK ONLY | BPSK, QPSK 16QAM, 64QAM |

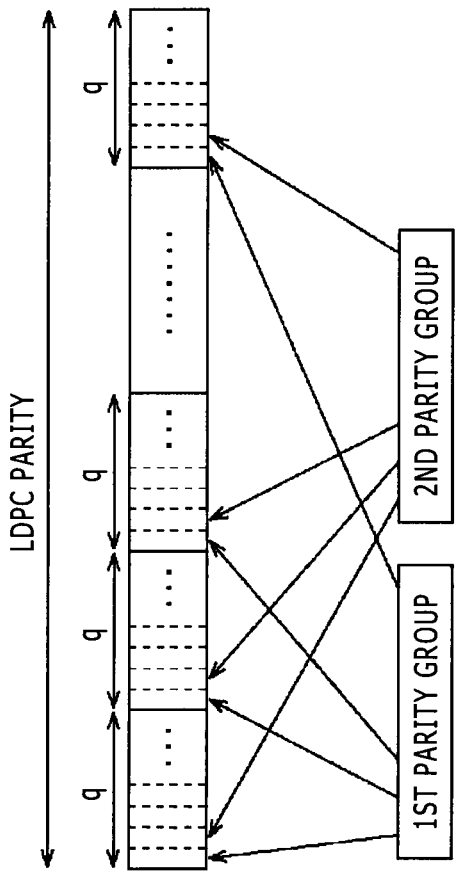

RECEPTION
INFORMATION $\;p0\;|\;1.0\;\;\;1.0\;\;\;1.0\;|\;p4\;\;\;p5\;\;\;p6\;\;\;p7\;\;\;p8\;\;\;p9$ $$H = \begin{pmatrix} 1 & 0 & 1 & 0 & 1 & 1 & 0 & 0 & 0 & 0 \\ 0 & 1 & 1 & 0 & 0 & 1 & 1 & 0 & 0 & 0 \\ 0 & 0 & 0 & 1 & 1 & 0 & 1 & 1 & 0 & 0 \\ 0 & 1 & 1 & 0 & 0 & 0 & 0 & 1 & 1 & 0 \\ 1 & 0 & 1 & 1 & 0 & 0 & 0 & 0 & 1 & 1 \end{pmatrix}$$

RECEPTION
INFORMATION $\;\;p0\;\;\;p4\;\;\;p5\;\;\;p6\;\;\;p7\;\;\;p8\;\;\;p9$ $$H = \begin{pmatrix} 1 & 1 & 1 & 0 & 0 & 0 & 0 \\ 0 & 0 & 1 & 1 & 0 & 0 & 0 \\ 0 & 1 & 0 & 1 & 1 & 0 & 0 \\ 0 & 0 & 0 & 0 & 1 & 1 & 0 \\ 1 & 0 & 0 & 0 & 0 & 1 & 1 \end{pmatrix}$$

FIG.17A

RECEPTION
INFORMATION  p0  1.0  1.0  1.0  p4  p5  p6  0.5  p8  p9

$$H = \begin{pmatrix} 1 & 0 & 1 & 0 & 1 & 1 & 0 & 0 & 0 & 0 \\ 0 & 1 & 1 & 0 & 0 & 1 & 1 & 0 & 0 & 0 \\ 0 & 0 & 0 & 1 & 1 & 0 & 1 & 1 & 0 & 0 \\ 0 & 1 & 1 & 0 & 0 & 0 & 0 & 1 & 1 & 0 \\ 1 & 0 & 1 & 1 & 0 & 0 & 0 & 0 & 1 & 1 \end{pmatrix}$$

FIG.17B $$H = \begin{pmatrix} 1 & 0 & 1 & 0 & 1 & 1 & 0 & 0 & 0 & 0 \\ 0 & 1 & 1 & 0 & 0 & 1 & 1 & 0 & 0 & 0 \\ 0\char`\^0 & 0\char`\^1 & 1\char`\^0 & 1\char`\^0 & 1\char`\^0 & 0\char`\^0 & 1\char`\^0 & 1\char`\^1 & 0\char`\^1 & 0\char`\^0 \\ 1 & 0 & 1 & 1 & 0 & 0 & 0 & 0 & 1 & 1 \end{pmatrix}$$

FIG.17C $$H = \begin{pmatrix} 1 & 0 & 1 & 0 & 1 & 1 & 0 & 0 & 0 & 0 \\ 0 & 1 & 1 & 0 & 0 & 1 & 1 & 0 & 0 & 0 \\ 0 & 1 & 1 & 1 & 1 & 0 & 1 & 0 & 1 & 0 \\ 1 & 0 & 1 & 1 & 0 & 0 & 0 & 0 & 1 & 1 \end{pmatrix}$$

FIG.17D $$H = \begin{pmatrix} 1 & 0 & 1 & 0 & 1 & 1 & 0 & 0 & 0 \\ 0 & 1 & 1 & 0 & 0 & 1 & 1 & 0 & 0 \\ 0 & 1 & 1 & 1 & 1 & 0 & 1 & 1 & 0 \\ 1 & 0 & 1 & 1 & 0 & 0 & 0 & 1 & 1 \end{pmatrix}$$

FIG. 18

WITH ZERO-PADDED COLUMNS DELETED, THE ORIGINAL MATRIX OF 5 ROWS BY 10 COLUMNS WITH 20 1'S MAY BE REDUCED TO A MATRIX OF 4 ROWS BY 6 COLUMNS WITH 10 1'S.

$$H = \begin{pmatrix} 1 & 1 & 1 & 0 & 0 & 0 \\ 0 & 0 & 1 & 1 & 0 & 0 \\ 0 & 1 & 0 & 1 & 1 & 0 \\ 1 & 0 & 0 & 0 & 1 & 1 \end{pmatrix}$$

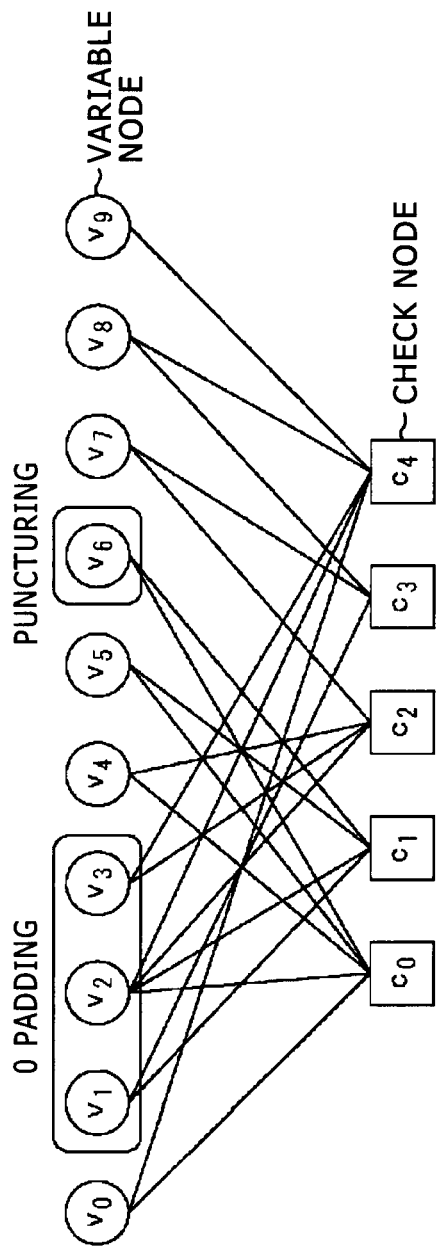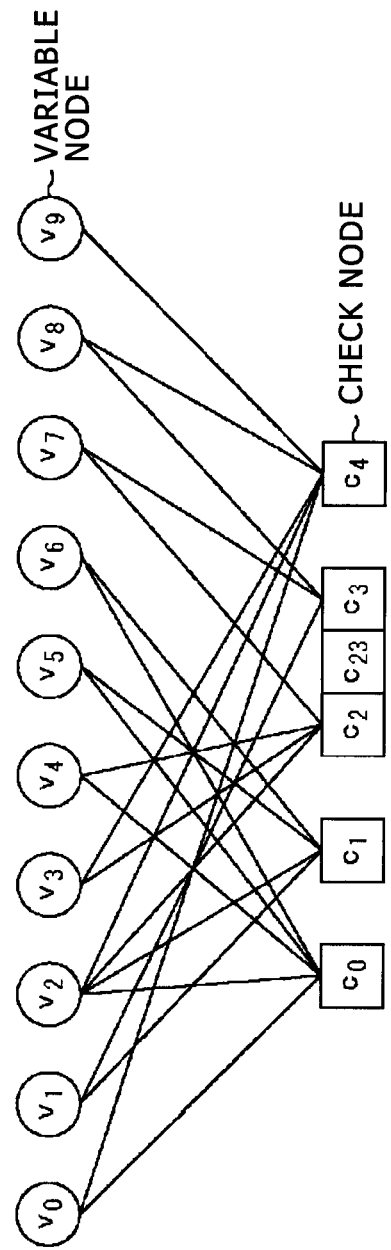
FIG.19A
FIG.19B

FIG.21A

UNIT MATRIX

FIG.21B

IN THE CASE OF 1

FIG.21C

IN THE CASE OF 359

FIG.21D

IN THE CASE OF 359'

FIG. 25

| 356 | -1 | 0 | -1 | -1 | -1 | -1 | -1 | 359 |
|---|---|---|---|---|---|---|---|---|
| 223+314 | -1 | 0 | 0 | -1 | 0 | -1 | -1 | -1 |
| 49+184+226+93 | 222+87 | -1 | 0 | 0 | -1 | -1 | -1 | -1 |
| 206+352 | 7 | -1 | -1 | 0 | 0 | -1 | -1 | -1 |
| 147+12 | -1 | -1 | -1 | -1 | 0 | 0 | -1 | -1 |
| 186 | -1 | -1 | -1 | -1 | -1 | 0 | 0 | 0 |

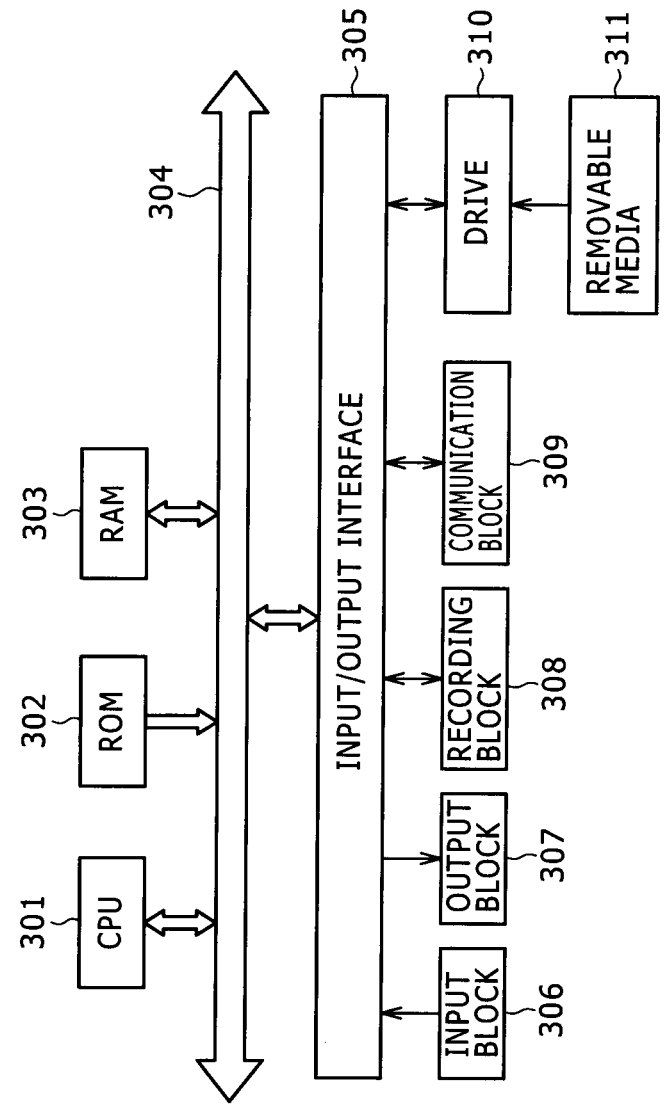

RECEIVING APPARATUS, RECEIVING METHOD, PROGRAM, AND RECEIVING SYSTEM

BACKGROUND OF THE INVENTION

1. Field of the Invention

The present invention relates to a receiving apparatus, a receiving method, a program, and a receiving system. More particularly, the invention relates to a receiving apparatus, a receiving method, a program, and a receiving system for enabling a receiver receiving a code sequence coded in LDPC and punctured at least partially to provide faster convergence for the LDPC decoding of the code sequence.

2. Description of the Related Art

Communication systems use coding to conduct reliable communications over noise-plagued communication channels. Illustratively, wireless systems such as satellite networks are exposed to numerous noise sources stemming from geographic and environmental factors. For the communication channels of these systems, a theoretical upper limit known as the Shannon limit is stipulated as a fixed capacity representing the number of bits per symbol for a given signal-to-noise ratio (SNR). As a result, one desire of coding design is to attain a rate approaching the Shannon limit. This desire has a particularly close relation with bandwidth-limited satellite systems.

In recent years, techniques known as turbo coding have been developed as coding methods for achieving performance close to the Shannon limit. The techniques thus developed illustratively include PCCC (Parallel Concatenated Convolutional Codes) and SCCC (Serially Concatenated Convolutional Codes). Apart from the turbo coding techniques, another coding method known for many years as Low Density Parity Check codes (called LDPC coding hereunder) is again attracting attention.

LDPC coding was first proposed by R. G. Gallager in "Low Density Parity Check Codes," Cambridge, Mass.; M.I.T. Press, 1963 (called the Non-Patent Document 1 hereunder). Recently, LDPC coding was again taken up by D. J. C. MacKay in "Good error correcting codes based on very parse matrices," submitted to IEEE Trans. Inf. Theory, IT-45, pp. 399-431, 1999 (called the Non-Patent Document 2 hereunder), and by M. G. Luby, M. Mitzenmacher, M. A. Shokrollahi, and D. A. Spielman in "Analysis of low density codes and improved designs using irregular graphs," in Proceedings of ACM Symposium on Theory of Computing, pp. 249-258, 1998 (called the Non-Patent Document 3 hereunder).

Recent studies have revealed that, as with turbo coding, LDPC coding provides performance closer to the Shannon limit the longer the code length involved. Noted for its property of letting minimum distance remain proportional to code length, LDPC coding offers such advantages as an improved block error rate and the virtual absence of the so-called error floor phenomenon that has been observed as characteristic of the decoding in turbo coding arrangements.

The above-mentioned advantages set the stage for LDPC coding to be adopted definitively by DVB (Digital Video Broadcasting)-T.2 (see "DVB BlueBook A122 Rev. 1, Frame structure channel coding and modulation for a second generation digital terrestrial television broadcasting system (DVB-T2)" at the DVB website updated on Sep. 1, 2008 (accessed on Mar. 17, 2009 on the Internet <URL: http://www.dvb.org/technology/standards/>; called the Non-Patent Document 4 hereunder). DVB-T.2 is the next-generation terrestrial digital broadcasting standard currently prepared (March 2009) by ETSI (European Telecommunication Standard Institute).

SUMMARY OF THE INVENTION

The need exists for receivers receiving a code sequence coded in LDPC (e.g., under L1 of DVB-T.2) and punctured at least partially to accelerate convergence for the LDPC decoding of the code sequence. However, the need has not been met sufficiently so far. Incidentally, L1 stands for Layer 1 (physical layer) transmission parameters. Details of L1 are discussed in the Non-Patent Document 4 cited above.

The present invention has been made in view of the above circumstances and provides a receiving apparatus, a receiving method, a program, and a receiving system for enabling a receiver receiving a code sequence coded in LDPC and punctured at least partially to accelerate convergence for the LDPC decoding of the code sequence.

In carrying out the present invention and according to one embodiment thereof, there is provided a receiving apparatus including: reception means for receiving a code sequence coded in LDPC (Low Density Parity Check) and punctured at least partially as a target to be decoded; and LDPC decoding means for performing a punctured matrix transform process including a first and a second process on an original parity check matrix noted to have punctured bits or symbols and used in the LDPC coding, the LDPC decoding means further performing the first process to carry out Galois field addition operations on those rows of the original parity check matrix which share non-zero elements with those columns of the original parity check matrix which correspond to the punctured bits or symbols in order to set the non-zero elements to zero, the LDPC decoding means further performing the second process to delete the columns rid of the non-zero elements in the first process, the LDPC decoding means further using the matrix resulting from the punctured matrix transform process as the parity check matrix for performing an LDPC decoding process on the code sequence received by the reception means.

Preferably, the code sequence received by the reception means may include a zero-padded code sequence coded in LDPC, and in addition to the punctured matrix transform process, the LDPC decoding means may perform a zero-padded matrix transform process to delete the columns corresponding to zero-padded bits or symbols on the original parity check matrix, the LDPC decoding means further using the matrix resulting from the punctured matrix transform process and the zero-padded matrix transform process as the parity check matrix for performing the LDPC decoding process on the code sequence received by the reception means.

Preferably, the code sequence received by the reception means may include code words having punctured zeros inserted through zero padding, and as part of the zero-padded matrix transform process, the LDPC decoding means may transform the original party check matrix into a matrix rid of the columns corresponding to the padded zeros.

Preferably, the LDPC decoding means may maintain the girth of the original parity check matrix in at least either the punctured matrix transform process or the zero-padded matrix transform process.

Preferably, the LDPC decoding means may change the girth of the original party check matrix in at least either the punctured matrix transform process or the zero-padded matrix transform process.

Preferably, the LDPC decoding means may maintain a minimum number of loops of the original parity check matrix in at least either the punctured matrix transform process or the zero-padded matrix transform process.

Preferably, the LDPC decoding means may change a minimum number of loops of the original parity check matrix in at least either the punctured matrix transform process or the zero-padded matrix transform process.

Preferably, the code sequence received by the reception means may be bit-interleaved; and the receiving apparatus may further include depuncture/zero depadding means for performing a depuncture and zero depadding process suitable for the matrix resulting from the punctured matrix transform process and the zero-padded matrix transform process.

Preferably, the receiver apparatus may comply with DVB (Digital Video Broadcasting)-T.2; and the code sequence received by the reception means may include at least a pre-signal from among the L1 signals stipulated by the DVB-T.2.

Preferably, the code sequence received by the reception means may further include a post-signal from among the L1 signals.

Preferably, the receiver apparatus may comply with DVB (Digital Video Broadcasting)-C.2; and the code sequence received by the reception means may include an L1 part-2 signal stipulated by the DVB-C.2.

Preferably, the LDPC decoding means may inhibit the process of deleting parallel processing units and the process of row transform for LDPC decoding in the punctured matrix transform process and zero-padded matrix transform process.

Preferably, the LDPC decoding means may not inhibit the process of deleting parallel processing units and the process of row transform for LDPC decoding in the punctured matrix transform process and zero-padded matrix transform process.

According to other embodiments of the present invention, there is provided a receiving method for use with the above-outlined receiving apparatus and representative of the functionality thereof, as well as a program equivalent to the inventive receiving method.

Where the present invention is practiced as the above-outlined receiving apparatus, receiving method, or program and where a code sequence coded in LDPC (Low Density Parity Check) and punctured at least partially is received as a target to be decoded, the following processing takes place: a punctured matrix transform process including a first and a second process is performed on an original parity check matrix noted to have punctured bits or symbols and used in the LDPC coding; the first process is performed to carry out Galois field addition operations on those rows of the original parity check matrix which share non-zero elements with those columns of the original parity check matrix which correspond to the punctured bits or symbols in order to set the non-zero elements to zero; the second process is performed to delete the columns rid of the non-zero elements in the first process; and the matrix resulting from the punctured matrix transform process is used as the parity check matrix for performing an LDPC decoding process on the code sequence received.

According to a further embodiment of the present invention, there is provided a receiving system including: acquisition means for acquiring over a transmission channel a signal including a code sequence coded in LDPC (Low Density Parity Check) and punctured at least partially; transmission channel decoding means for performing a transmission channel decoding process on the signal acquired by the acquisition means over the transmission channel, the transmission channel decoding process including a process of correcting errors that may have occurred in the signal along the transmission channel, thereby obtaining and outputting an error-corrected signal. The receiving system further includes either information source decoding means for performing an information source decoding process on the output signal from the transmission channel decoding means, or recording means for recording the output signal from the transmission channel coding means to a recording medium. The transmission channel decoding means includes LDPC decoding means for performing a punctured matrix transform process including a first and a second process on an original parity check matrix noted to have punctured bits or symbols and used in the LDPC coding. The LDPC decoding means further performs the first process to carry out Galois field addition operations on those rows of the original parity check matrix which share non-zero elements with those columns of the original parity check matrix which correspond to the punctured bits or symbols in order to set the non-zero elements to zero. The LDPC decoding means further performs the second process to delete the columns rid of the non-zero elements in the first process. The LDPC decoding means further uses the matrix resulting from the punctured matrix transform process as the parity check matrix for performing an LDPC decoding process on the code sequence acquired by the acquisition means.

Where the present invention is practiced as the above-outlined receiving system, the system contains the acquisition means acquiring over a transmission channel a signal including a code sequence coded in LDPC (Low Density Parity Check) and punctured at least partially; the transmission channel decoding means performing a transmission channel decoding process on the signal acquired by the acquisition means over the transmission channel, the transmission channel decoding process including a process of correcting errors that may have occurred in the signal along the transmission channel, thereby obtaining and outputting an error-corrected signal. The system further contains either the information source decoding means performing an information source decoding process on the output signal from the transmission channel decoding means, or the recording means recording the output signal from the transmission channel coding means to a recording medium. The transmission channel decoding means performs its processing as follows: a punctured matrix transform process including a first and a second process is performed on an original parity check matrix noted to have punctured bits or symbols and used in the LDPC coding, the first process being performed to carry out Galois field addition operations on those rows of the original parity check matrix which share non-zero elements with those columns of the original parity check matrix which correspond to the punctured bits or symbols in order to set the non-zero elements to zero, the second process being performed to delete the columns rid of the non-zero elements in the first process. The matrix resulting from the punctured matrix transform process is then used as the parity check matrix for performing an LDPC decoding process on the code sequence received.

As outlined above, the receiving apparatus according to the present invention and receiving a code sequence coded in LDPC and punctured at least partially provides faster convergence for the LDPC decoding of the code sequence. Illustratively, a receiving apparatus of the invention complying with DVB-T.2 permits significantly faster convergence for the LDPC decoding of L1 signals.

BRIEF DESCRIPTION OF THE DRAWINGS

FIG. 10 is a tabular view explanatory of the functions of the components making up the L1 generation block in FIG. 9;

FIGS. 15A, 15B and 15C are schematic views explanatory of how puncture is illustratively effected;

FIGS. 17A, 17B, 17C and 17D are schematic views explanatory of a typical technique for reducing a punctured parity check matrix;

FIG. 18 is a schematic view showing a parity check matrix obtained through the combination of the zero-padded parity check matrix reducing technique and the punctured parity check matrix reducing technique;

FIGS. 19A and 19B are typical Tanner graphs explanatory of a process that combines the zero-padded parity check matrix reducing technique with the punctured parity check matrix reducing technique;

FIGS. 21A, 21B, 21C and 21D are schematic views showing results of the process which combines the zero-padded parity check matrix reducing technique with the punctured parity check matrix reducing technique and which is performed on the parity check matrix of the actual size;

FIG. 25 is a schematic view showing other results of the process which combines the zero-padded parity check matrix reducing technique with the punctured parity check matrix reducing technique and which is performed on the parity check matrix of the actual size;

FIG. 30 is a block diagram showing a typical hardware structure of the receiving apparatus to which an embodiment of the present invention is applied.

DETAILED DESCRIPTION OF THE PREFERRED EMBODIMENTS

Explanation of LDPC Codes

Figure 1:
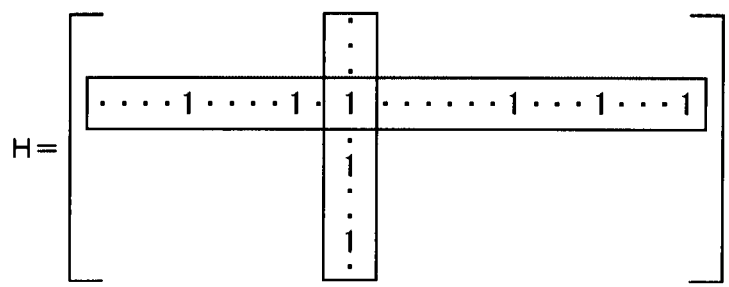
FIG. 1 is a schematic view showing a typical parity check matrix in LDPC codes.

The LDPC codes will be outlined hereunder for a better understanding of the present invention.

Although the LDPC codes are linear codes and do not have to be two-dimensional, the ensuing description will be made on the assumption that the LDPC codes are two-dimensional.

The biggest characteristic of the LDPC codes is that the parity check matrix for defining the codes is sparse. A sparse matrix is a matrix in which the number of 1's as components of the matrix is very small. In the description that follows, the sparse parity check matrix will be denoted by reference character H.

FIG. 1 shows a typical parity check matrix H.

In the parity check matrix H of FIG. 1, the Hamming weight (i.e., number of 1's) of each column is "3" and that of each row is "6."

The LDPC codes defined by a parity check matrix H in which the Hamming weight is constant in each row and each column as in the matrix of FIG. 1 are called regular LDPC codes. On the other hand, the LDPC codes defined by a parity check matrix H in which the Hamming weight in each row and each column is not constant are called irregular LDPC codes.

The coding by use of such LDPC codes is implemented by first generating a generator matrix G based on the parity check matrix H and then multiplying by this generator matrix G two-dimensional information messages so as to generate code words.

More specifically, a coding apparatus for coding in LDPC codes first calculates a generator matrix G such that $GH^T=0$, where $H^T$ stands for a transposed matrix of the parity check matrix H. If the generator matrix G is made up of a k×n matrix, the coding apparatus multiplies the generator matrix G by an information message made of "k" bits (vector "u") to generate a code word "c" (=uG) formed by "n" bits. In the code word thus generated by the coding apparatus, "0" sign bits are mapped to "+1" each and "1" sign bits mapped to "−1" each before transmission of the code word. The code word is transmitted over a predetermined transmission channel and received on the receiving side.

The decoding of LDPC codes is implemented using an algorithm proposed by Gallager as probabilistic decoding. This algorithm is a message passing algorithm based on belief propagation through so-called Tanner graphs constituted by variable nodes also called message nodes as well as by check nodes. In the ensuing description, the variable nodes and check nodes may be simply called the nodes where appropriate.

In probabilistic decoding, each message passed from one node to another is a real number. It follows that analytical decoding may require keeping track of the probability distribution of the messages taking serial values. This can be an analysis achieved with a great deal of difficulty. To circumvent this bottleneck, Gallager proposes algorithm A or algorithm B as the decoding algorithm for LDPC codes.

Figure 2:
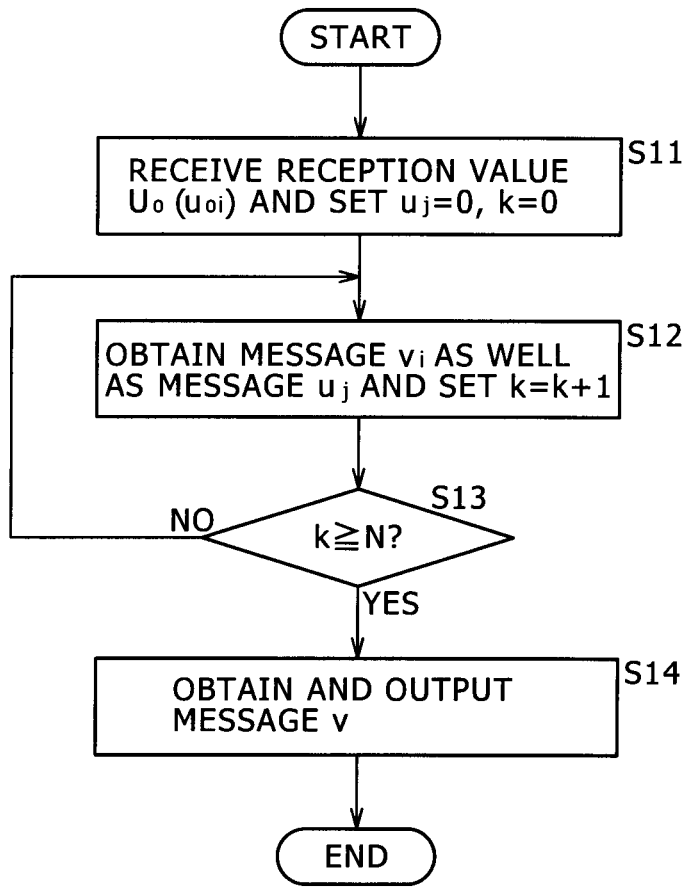
FIG. 2 is a flowchart explanatory of a series of steps for decoding LDPC codes.

FIG. 2 shows a typical procedure for decoding LDPC codes. That is, the decoding of LDPC codes is carried out typically using the procedure such as one shown in FIG. 2. In the ensuing description, $U_o(u_{0i})$ stands for the i-th reception data in LDPC codes of a code length; $u_j$ denotes the j-th message output from a check node (i.e., message output from the j-th edge connected to a check node); and $v_i$ represents the i-th message output from a variable node (i.e., message output from the i-th edge connected to a variable node). It is assumed that each message is a real value representing the likelihood of the value being "0," such as log likelihood ratio.

Referring to FIG. 2, reception data $U_o(u_{0i})$ is received in step S11. Also in step S11, a message $u_j$ is initialized to "0" and a variable "k" that takes an integer for an iteration counter is further initialized to "0."

In step S12, the message $v_i$ is obtained by performing the variable node operation shown in the expression (1) shown below. With the message $v_i$ acquired, the message $u_j$ is obtained by carrying out the check node operation shown in the expression (2) below using the message $v_i$. The expressions are:

$$v_i = u_{0i} + \sum_{j=1}^{d_v-1} u_j \quad (1)$$

$$\tanh\left(\frac{u_j}{2}\right) = \prod_{i=1}^{d_c-1} \tanh\left(\frac{v_i}{2}\right) \quad (2)$$

where, $d_v$ stands for the number of 1's in the vertical (column) direction of the parity check matrix H and $d_c$ for the number of 1's in the horizontal (row) direction of the parity check matrix H. That is, $d_v$ and $d_c$ denote parameters which represent the Hamming weights of each column and each row and which may be selected as desired. For example, $d_v=3$ and $d_c=6$ are selected in the case of (3, 6) LDPC codes.

In the expression (1) or (2) above, the messages that are input from message-outputting edges are not used as a target for additions or multiplications. It follows that the additions or multiplications range from 1 to $d_v-1$ or from 1 to $d_c-1$. The operation in the expression (2) above may be carried out by preparing beforehand a table of function $R(v_1, v_2)$ in the expression (3) below whereby 1 is obtained from two inputs $v_1$ and $v_2$, and by using the table consecutively (i.e., recursively) as shown in the expression (4) below. The expressions are:

$$x = 2\tanh^{-1}\left\{\tanh\left(\frac{v_1}{2}\right)\tanh\left(\frac{v_2}{2}\right)\right\} = R(v_1, v_2) \quad (3)$$

$$u_j = R(v_1, R(v_2, R(v_3, \ldots R(v_{d_c-2}, v_{d_c-1})))) \quad (4)$$

In step S12, the variable "k" is incremented by "1." Step S12 is followed by step S13.

In step S13, a check is made to determine whether the variable "k" is equal to or larger than a predetermined decoding iteration count N. If in step S13 the variable "k" is found neither equal to nor larger than the count N, control is returned to step S12 and the subsequent steps are repeated.

If in step S13 the variable "k" is found equal to or larger than the count N, then step S14 is reached. In step S14, the operation shown in the expression (5) below is carried out to obtain a message "v" as the result of decoding to be output definitively. This step terminates the process of decoding the LDPC codes. The expression is:

$$v = u_{0i} + \sum_{j=1}^{d_v} u_j \quad (5)$$

Unlike the operation of the expression (1), the operation of the expression (5) above utilizes the messages $u_j$ stemming from all edges connected to the variable nodes.

Figures 3, 4:
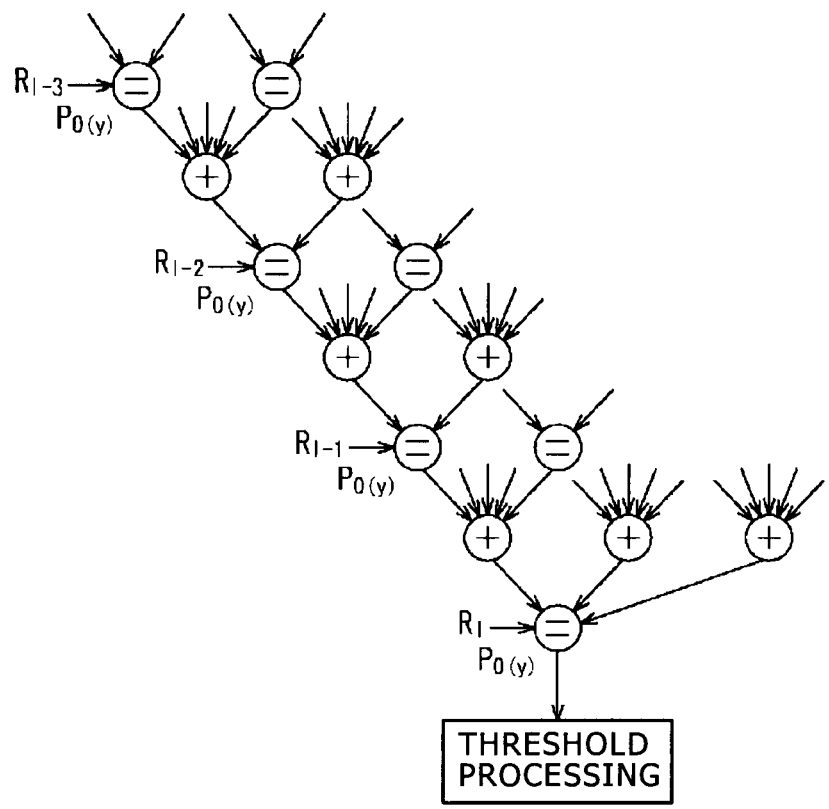
FIG. 3 is a schematic view explanatory of message flows.
FIG. 4 is a schematic view showing a typical parity check matrix in (3, 6) LDPC codes.

FIG. 3 is a schematic view explanatory of message flows where the (3, 6) codes adopted as the LDPC codes are to be decoded.

Where the (3, 6) LDPC codes are to be decoded, messages are exchanged between the nodes as shown in FIG. 3. In FIG. 3, each node identified by the equal symbol (=) is a variable node subject to the variable node operation in the expression (1) above. Each node identified by the plus symbol (+) in FIG. 3 is a check node subject to the check node operation in the expression (2) above.

With algorithm A in particular, messages are rendered two-dimensional. At each check node (identified by "+"), as many as $d_c-1$ input messages (message $v_i$ input to the check node) are subjected to the EXCLUSIVE-OR operation. At each variable node (identified by "="), as many as $d_v-1$ input messages (message $u_j$ input to the variable node) may all have bit values different from those of reception data R. If that is the case, the sign is inverted upon output.

The decoding of LDPC codes will be explained schematically below.

FIG. 4 shows a typical parity check matrix H in (3, 6) LDPC codes (wherein the code rate is ½ and the code length is 12).

Figure 5:
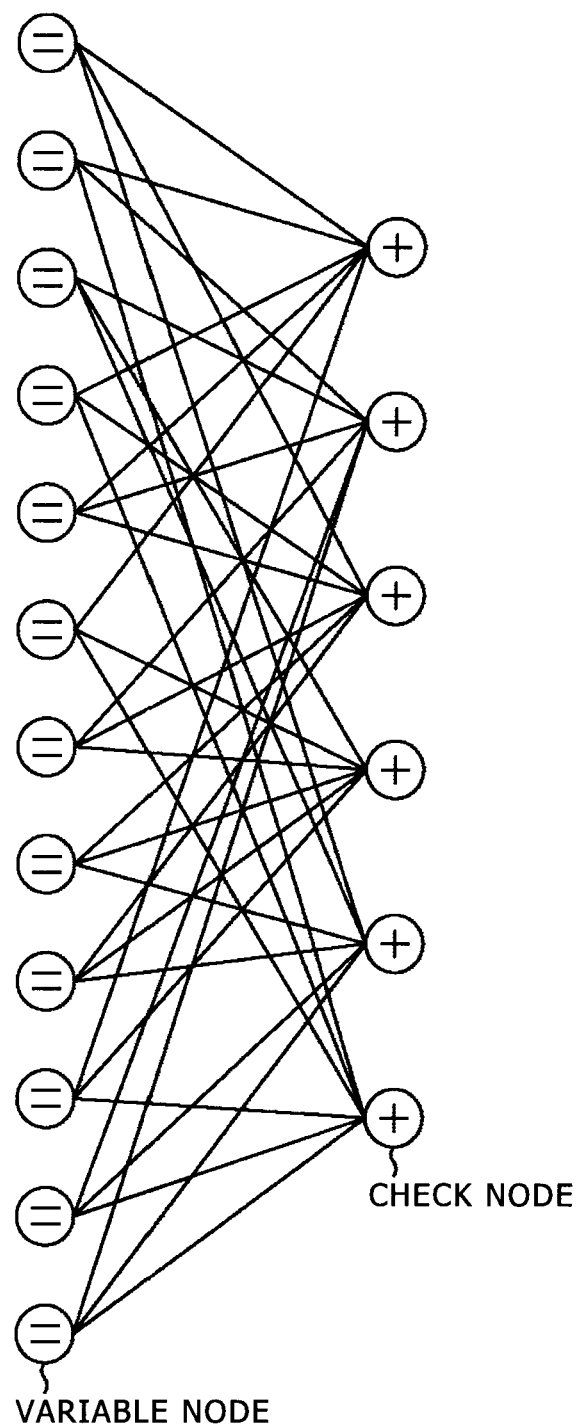
FIG. 5 is a typical Tanner graph relative to the parity check matrix of FIG. 4.

FIG. 5 is a typical Tanner graph relative to the parity check matrix H of FIG. 4.

As shown in FIG. 5, the parity check matrix H in LDPC codes can be expressed using a Tanner graph. In FIG. 5, the symbol "+" stands for check nodes and the symbol "=" for variable nodes. The check nodes and variable nodes correspond to the rows and columns of the parity check matrix, respectively. The connections between the check nodes and variable nodes constitute edges corresponding to 1's in the parity check matrix H. That is, if the component in the j-th row and the i-th column of the parity check matrix is 1, then the i-th variable node (identified by "=") from the top and the j-th check node (identified by "+") from the top are connected by an edge. An edge signifies that a bit (of reception data) in LDPC code corresponding to a variable node has a restraint condition corresponding to a check node.

The sum product algorithm, a decoding technique for LDPC codes, involves performing the variable node operation and check node operation recursively.

Figure 6:
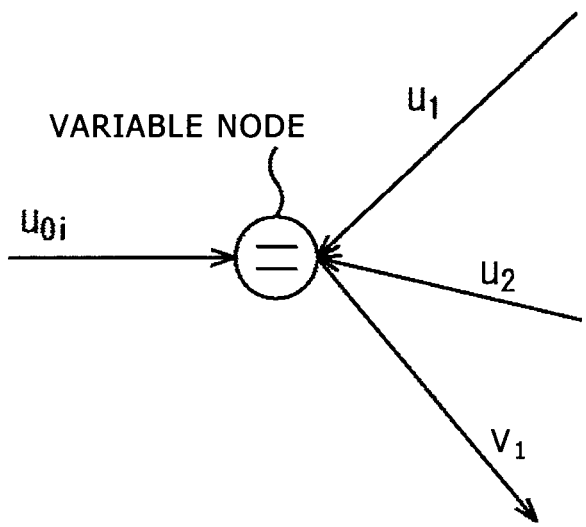
FIG. 6 is a schematic view explanatory of message calculations at a variable node.

FIG. 6 is a schematic view explanatory of message calculations at a variable node.

At a variable node, as shown in FIG. 6, the variable node operation in the expression (1) above is carried out. In FIG. 6, a message $v_i$ corresponding to the i-th of the edges connected to the variable node is calculated using messages $u_1$ and $u_2$ corresponding to the remaining edges connected to the variable node as well as reception data $u_{0i}$. The messages corresponding to the other edges are calculated likewise.

Preparatory to an explanation of the check node operation, the expression (2) above is transformed into the expression (6) below by use of the relational expression $a \times b = \exp\{\ln(|a|) + \ln(|b|)\} \times \text{sign}(a) \times \text{sign}(b)$, where $\text{sign}(x)$ is 1 (logical 0) when $x \geq 0$ and is $-1$ (logical 1) when $x < 0$. The transformed expression is:

$$u_j = 2\tanh^{-1}\left(\prod_{i=1}^{d_c-1} \tanh\left(\frac{v_i}{2}\right)\right) \quad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

Suppose that when $x \geq 0$, a nonlinear function $\phi(x) = -\ln(\tan h(x/2))$ is defined. In that case, the inverse function $\phi^{-1}(x)$ is expressed as $$\phi^{-1}(x) = 2\tan h^{-1}(e^{-x})$$

so that the expression (6) above may be transformed into the following expression:

$$u_j = \phi^{-1}\left(\sum_{i=1}^{d_c-1} \phi(|v_i|)\right) \times \prod_{i=1}^{d_c-1} \text{sign}(v_i) \quad (7)$$

Figure 7:
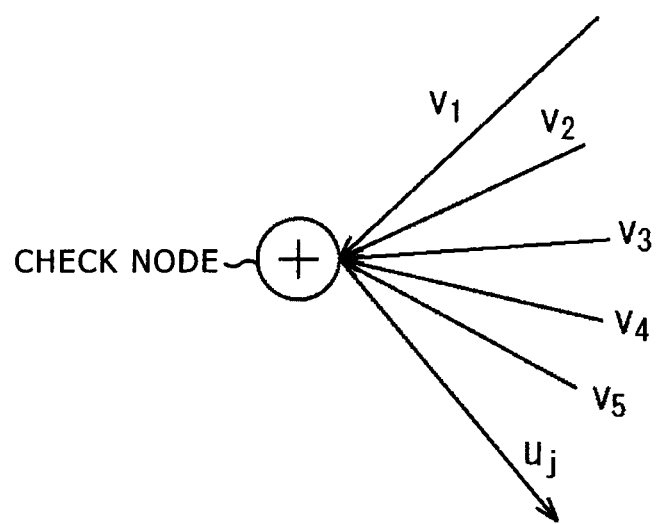
FIG. 7 is a schematic view explanatory of message calculations at a check node.

FIG. 7 is a schematic view explanatory of message calculations at a check node. As shown in FIG. 7, the check node operation in the expression (7) above is carried out at a check node. In FIG. 7, a message $u_j$ corresponding to the j-th of the edges connected to the check node is calculated using messages $v_1$, $v_2$, $v_3$, $v_4$ and $v_5$ corresponding to the remaining edges connected to the check node. The messages corresponding to the other edges are calculated likewise.

The function $\phi(x)$ may be transformed into $\phi(x) = \ln((e^x+1)/(e^x-1))$. If $x > 0$, then the result of the operation of $\phi(x) = \phi^{-1}(x)$ (i.e., nonlinear function $\phi(x)$) is the same as the result of the operation of the inverse function $\phi^{-1}(x)$. If the functions $\phi(x)$ and $\phi^{-1}(x)$ are implemented in hardware using a look-up table (LUT) each, both functions have the same LUT.

The variable node operation in the expression (1) above may be divided into the expression (5) above and the following expression (8):

$$v_i = v - u_{d_v} \quad (8)$$

Thus the variable node operation in the expression (1) and the check node operation in the expression (7) may be performed recursively by repeating the operations of the expressions (5) and (8) as well as the operation of the expression (7) above.

In this case, the result of the operation of the expression (5) as part of the variable node operation performed using the expressions (5) and (8) may be used as the definitive result of decoding.

Where the sum product algorithm is to be implemented in hardware for use as part of the decoding apparatus, it may be necessary to perform recursively the variable node operation in the expression (1) (or in the expressions (5) and (8)) and the check node operation in the expression (7) using a suitable operating frequency with circuitry of an appropriate scale.

Structure of the Transmitting Apparatus Complying with DVB-T.2

Preparatory to an explanation of the receiving apparatus embodying the present invention, a typical structure of a transmitting apparatus corresponding to the inventive receiving apparatus (i.e., DVB-T.2 compatible transmitting apparatus) will be described below.

Figure 8:
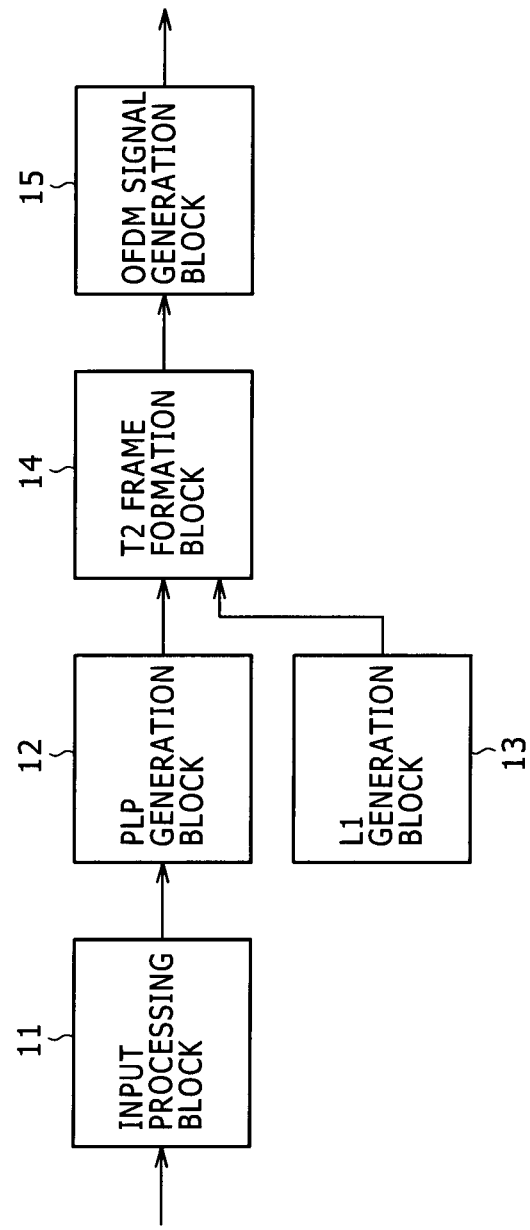
FIG. 8 is a block diagram showing a typical structure of a transmitting apparatus complying with DVB-T.2.

FIG. 8 shows a typical structure of such a transmitting apparatus complying with DVB-T.2.

In digital broadcasts under DVB-T.2, the LDPC codes are used as symbols of quadrature modulation (digital modulation) such as QPSK (Quadrature Phase Shift Keying). These symbols are mapped to constellation points when transmitted. Illustratively, this embodiment of the invention adopts OFDM (Orthogonal Frequency Division Multiplexing) as the modulation method for digital broadcasts.

The transmitting apparatus illustrated in FIG. 8 functions as a digital broadcast transmitting apparatus based on DVB-T.2. Thus the transmitting apparatus is structured to include an input processing block 11, a PLP generation block 12, an L1 generation block 13, a T2 frame formation block 14, and an OFDM signal generation block 15.

The input processing block 11 inputs video and audio signals constituting broadcast programs. After suitably processing the input signals, the input processing block 11 forwards the processed signals to the PLP generation block 12.

The PLP generation block 12 subjects the output signals from the input processing block 11 to various interleaving processes as well as coding and other processes such as LDPC coding in order to generate PLP (physical layer pipe). The generated PLP constitutes a data stream according to DVB-T.2. After getting generated in this manner, PLP is supplied to the T2 frame formation block 14.

The L1 generation block 13 generates L1 and performs diverse processes including zero padding and LDPC coding on the generated L1. L1 thus processed is output to the T2 frame formation block 14.

L1 represents Layer 1 (physical layer) parameters. L1 includes modulation and demodulation parameters, PLP positions and sizes, and error correcting codes. In the case of a multiple PLP (multi-PLP) formation, the position and size of PLP vary from one T2 frame to another. That means the desired PLP may not be extracted after a frequency deinterleaving process unless L1 is taken. The T2 frame is the unit of transmission in the physical layer under DVB-T.2. As such, the T2 frame is made up of data symbols including PLP and P1 and P2 symbols. L1 is included in the P2 symbol of each T2 frame. Details of L1 are disclosed in the Non-Patent Document 4 cited above. A detailed structure of the L1 generation block 13 will be discussed later in reference to FIG. 9.

The T2 frame formation block 14 forms the above-described T2 frames using PLP generated by the PLP generation block 12 and L1 generated by the L1 generation block 13. That is, the T2 frame formation block 14 outputs a transmission signal of which the units are T2 frames. The transmission signal thus output is fed to the OFDM signal generation block 15.

The OFDM signal generation block 15 performs the above-described OFDM modulation process on the transmission signal output from the T2 frame formation block 14, and outputs the resulting signal (called the OFDM signal hereunder). This OFDM signal is broadcast as the broadcast wave.

Figure 9:
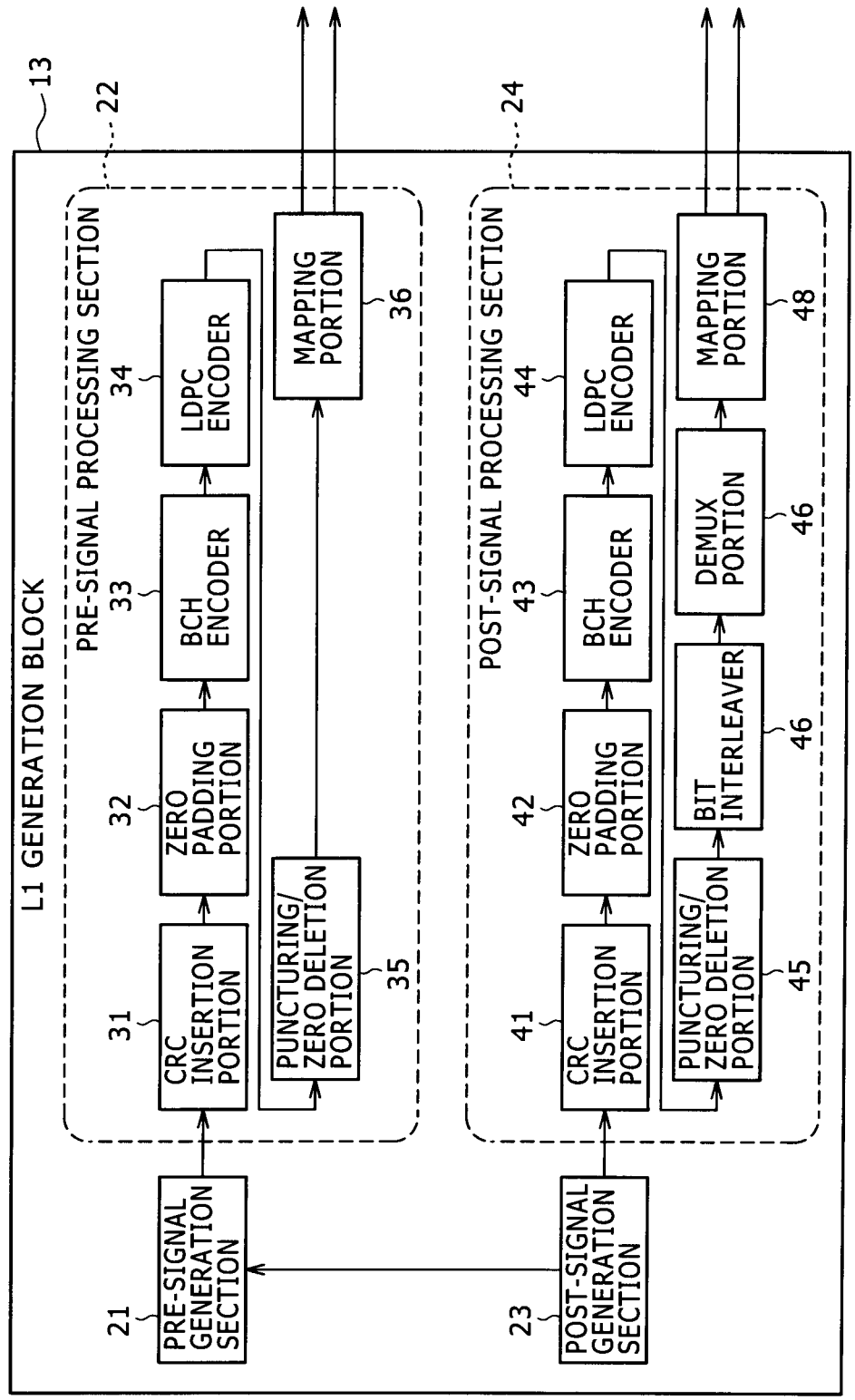
FIG. 9 is a block diagram showing a detailed structure of an L1 generation block in the transmitting apparatus of FIG. 8.

FIG. 9 shows a detailed structure of the L1 generation block 13 in the transmitting apparatus of FIG. 8.

FIG. 10 is a tabular view explanatory of the functions of the components making up the L1 generation block 13 in FIG. 9.

L1 generated by the L1 generation block 13 is formed principally by two signals: pre-signal and post-signal.

The pre-signal is a signal of which the data length K is fixed to 168 bits as shown in FIG. 10. This signal includes OFDM information such as pilot patterns as well as information about the post-signal. That is, the information contained in the pre-signal is needed to interpret the post-signal.

The post-signal is a signal of which the data length K varies with parameters as shown in FIG. 10. This signal contains PLP information such as the size of LDPC codes, code rate, and modulation method.

The L1 generation block 13 includes a pre-signal generation section 21 for generating the pre-signal and a pre-signal processing section 22 for processing the pre-signal. The L1 generation block 13 further includes a post-signal generation section 23 for generating the post-signal and a post-signal processing section 24 for processing the post-signal.

The pre-signal processing section 22 is structured to include a CRC insertion portion 31, a zero padding portion 32, a BCH encoder 33, an LDPC encoder 34, a puncturing/zero deletion portion 35, and a mapping portion 36.

The post-signal processing section 24 is structured to include a CRC insertion portion 41, a zero padding portion 42, a BCH encoder 43, an LDPC encoder 44, a puncturing/zero deletion portion 45, a bit interleaver 46, a demux portion 47, and a mapping portion 48.

Described below in reference to FIG. 10 are the functions of the components making up the pre-signal processing section 22 and post-signal processing section 24.

In the pre-signal processing section 22, the CRC insertion portion 31 adds 32 bits CRC (cyclic redundancy check) to the pre-signal generated by the pre-signal generation section 21, and outputs the resulting Ksig-bit signal. In this case, the value Ksig denotes 200 bits.

The zero padding portion 32 inserts 2872-bit zeros into the output signal from the CRC insertion portion 31. The obtained result is a Kbch=3072 signal that is output.

The BCH encoder 33 puts the output signal from the zero padding portion 32 into BCH codes and supplements the signal with 168 parity bits. The obtained result is an Nbch=3240 signal that is output.

The LDPC encoder 34 puts the output signal from the BCH encoder 33 into LDPC codes and outputs the resulting Nldpc=16,200 signal. The code rate involved is ¼. Although the above-cited Non-Patent Document 4 refers to the nominal code rate of ¼, the precise code rate is in fact ⅕.

The puncturing/zero deletion portion 35 deletes from the output signal of the LDPC encoder 34 the zeros inserted by the zero padding portion 32, thereby puncturing the LDPC parity bits.

The mapping portion 36 maps the output signal from the puncturing/zero deletion portion 35. The mapping process of the mapping portion 36 is targeted at BPSK alone.

In contrast to the pre-signal processing section 22 described above, the post-signal processing section 24 has its CRC insertion portion 41 adding 32 CRC bits to the post-signal generated by the post-signal generation section 23 and outputting the resulting Ksig-bit signal.

The zero padding portion 42 inserts zeros of (7032-Ksig) bits to the output signal from the CRC insertion portion 41. The obtained result is a Kbch=3072 signal that is output.

The BCH encoder 43 puts the output signal from the zero padding portion 42 into BCH codes and supplements the signal with 168 parity bits. The obtained result is an Nbch=7200 signal that is output.

The LDPC encoder 44 puts the output signal from the BCH encoder 43 into LDPC codes and outputs the resulting Nldpc=16,200 signal. The code rate involved is ½. Whereas the above-cited Non-Patent Document 4 refers to the nominal code rate of ¼, the precise code rate is in fact ⅘.

The puncturing/zero deletion portion 45 deletes the zeros inserted by the zero padding portion 42 from the output signal of the LDPC encoder 44, thereby puncturing the LDPC parity bits.

The bit interleaver 46 performs a bit interleaving process in units of the LDPC sign bit on the output signal from the puncturing/zero deletion portion 45.

The demux portion 47 performs the same demux process as that performed by the PLP generation block 12 in FIG. 8 on the output signal from the bit interleaver 46.

The mapping portion 48 maps the output signal from the demux portion 47. The mapping process of the mapping portion 48 is targeted at BPSK, QPSK, 16QAM, and 64QAM.

Structure of the Receiving Apparatus Complying with DVB-T.2

Explained below is the receiving apparatus corresponding to the above-described transmitting apparatus complying with DVB-T.2, i.e., the receiving apparatus implemented as an embodiment of the present invention.

Figure 11:
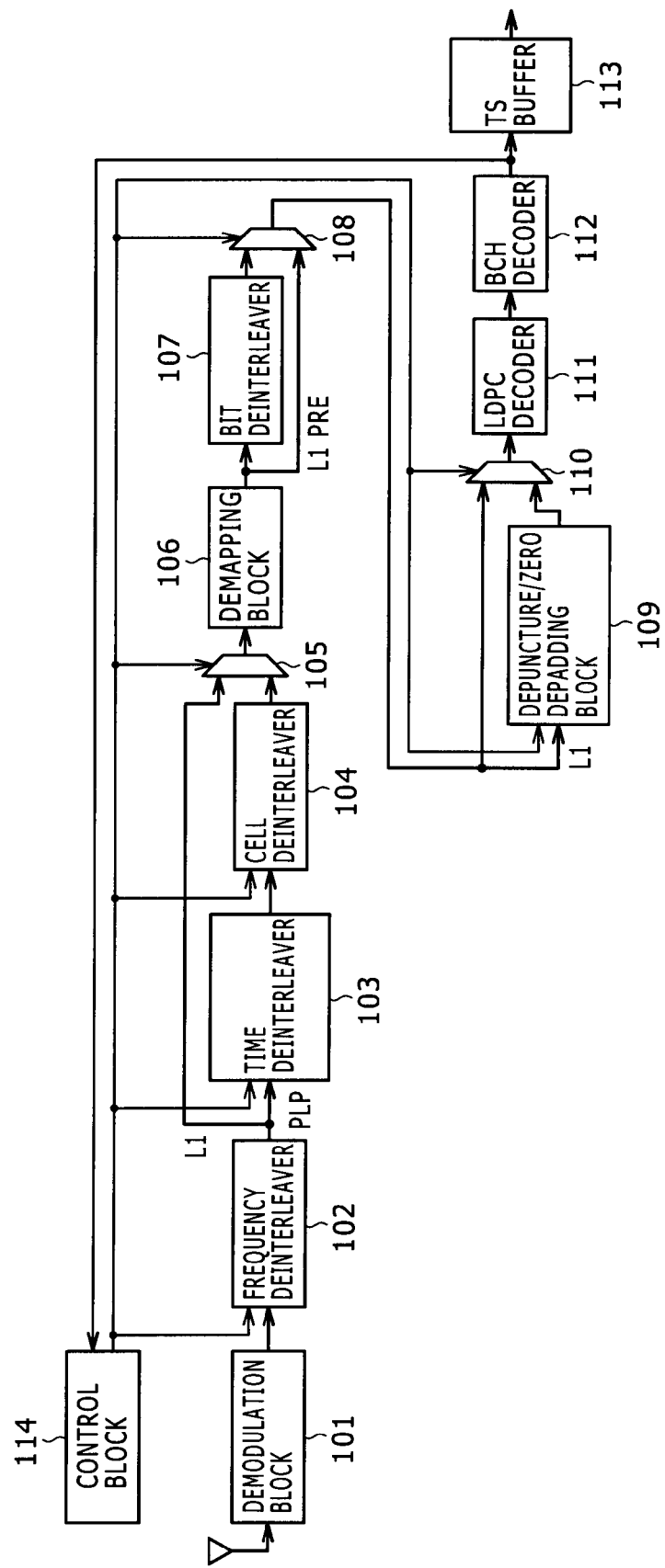
FIG. 11 is a schematic view showing a typical structure of a receiving apparatus to which the present invention is applied.

FIG. 11 shows a typical structure of the receiving apparatus to which the present invention is applied.

The receiving apparatus shown in FIG. 11 functions as a digital broadcast receiving apparatus in compliance with DVB-T.2. The receiving apparatus thus contains a demodulation block 101, a frequency deinterleaver 102, a time deinterleaver 103, a cell deinterleaver 104, and a switching block 105. The receiving apparatus further includes a demapping block 106, a bit deinterleaver 107, a switching block 108, a depuncture/zero depadding block 109, a switching block 110, an LDPC decoder 111, a BCH decoder 112, a TS buffer 113, and a control block 114.

The broadcast wave coming from a broadcasting station possessing the transmitting apparatus of FIG. 8 is received by the receiving apparatus of FIG. 11. The received broadcast wave is turned into an IF signal by a tuner or the like (not shown) before being fed to the modulation block 101. The IF signal is an input signal to the demodulation block 101. The demodulation block 101 proceeds to subject the input signal to quadrature demodulation whereby a baseband OFDM signal is obtained. The demodulation block 101 outputs the baseband OFDM signal thus acquired to the frequency deinterleaver 102.

That is, the output signal from the demodulation block 101 becomes the input signal to the frequency deinterleaver 102. The frequency deinterleaver 102 performs a frequency deinterleaving process on the input signal. Specifically, the frequency deinterleaver 102 corresponds to a deinterleaver embedded in OFDM symbols. The unit of the processing is a cell (in units of an OFDM carrier in this case).

More specifically, the input signal to the frequency deinterleaver 102 is a so-called OFDM frequency domain signal having undergone FFT (Fast Fourier Transform). In performing the frequency deinterleaving process, the frequency deinterleaver 102 rearranges the carrier positions of the input signal as the OFDM frequency domain signal using a pseudo random pattern.

That is, as described above, the T2 frame under DVB-T.2 includes the P1 symbol, P2 symbol, and data symbol. The P1 symbol is removed by the demodulation block 101 at its output stage. Thus the OFDM frequency domain signal formed by the P2 symbol and data symbol is fed to the frequency deinterleaver 102 as the latter's input signal. In turn, the frequency deinterleaver 102 outputs the P2 symbol and data symbol both having undergone the frequency deinterleaving process.

As mentioned above, the P2 symbol includes L1, and the data symbol includes PLP. Thus as part of the output signals from the frequency deinterleaver 102, a data signal corresponding to PLP is supplied to the time deinterleaver 103. Meanwhile, as part of the output signals from the frequency deinterleaver 102, a transmission control signal corresponding to L1 is fed to the switching block 105.

The signal output from the frequency deinterleaver 102 and input to the time deinterleaver 103 has undergone the block interleaving process (time interleaving process) across a plurality of LDPC codes on the transmitting side (performed by the PLP generation block 12 in FIG. 8). The unit of the block interleaving process is a cell (in units of a constellation in this case). The time deinterleaver 103 thus performs on the input signal a deinterleaving process corresponding to the time interleaving process, and forwards the resulting signal to the cell deinterleaver 104.

The signal output from the time deinterleaver 103 and input to the cell deinterleaver 104 has undergone the interleaving process (cell interleaving process) embedded in LDPC symbols (performed by the PLP generation block 12 in FIG. 8). The unit of the processing is a cell (in units of a constellation in this case). The cell interleaver 104 thus performs a deinterleaving process corresponding to the cell interleaving process on the input signal, and outputs the resulting signal to the switching block 105.

In the manner described above, the input of the switching block 105 is supplied with the transmission control signal corresponding to L1 output from the frequency deinterleaver 102 (the signal is called L1 hereunder where appropriate) and with the data signal corresponding to PLP output from the cell deinterleaver 104 (the signal is called PLP hereunder where appropriate). Under control of the control block 114, the switching block 105 selectively outputs either L1 or PLP.

The demapping block 106 transforms the output data from the switching block 105 into data in units of the sign bit of LDPC codes. Of the output data from the switching block 105, the pre-signal of L1 is fed to the switching block 108 and PLP and the post-signal of L1 are supplied to the bit deinterleaver 107.

The data output from the demapping block 106 and input to the bit deinterleaver 107 has undergone the bit interleaving process in units of the sign bit of LDPC codes on the transmitting side (performed by the PLP generation block 12 in FIG. 8 or by the bit interleaver 46 in FIG. 9). The bit deinterleaver 107 thus performs a bit deinterleaving process on the input data. The bit deinterleaving process provides the LDPC codes in which the sign bit is returned to its original position in effect before the bit interleaving process. This signal in LDPC codes is sent to the switching block 108 as the output signal from the bit deinterleaver 107.

Under control of the control block 114, the switching block 108 selects either L1 or PLP as output data. That is, L1 is fed to the depuncture/zero depadding block 109, while PLP is supplied to the switching block 110.

L1 fed to the depuncture/zero depadding block 109 is formed by LDPC codes of which the information sequence includes padded zeros and of which the code sequence is punctured. For this reason, the LDPC decoder 111 (to be discussed later) transforms the LDPC codes into a matrix of which the parity check matrix H has fewer rows and columns than before for decoding purposes. Thanks to the use of a matrix smaller than the parity check matrix H in effect before transformation, the LDPC decoding makes it possible to reduce the size of the memory for holding the matrix as well as the amount of the decoding processes involved.

The depuncture/zero depadding block 109 thus performs a depuncture process and a zero depadding process on the input L1 so as to obtain a reception sequence suitable for the matrix having undergone transformation.

The output signal (L1) from the depuncture/zero depadding block 109 is fed to the switching block 110. As mentioned above, the output signal (PLP) from the switching block 108 is also sent to the switching block 110. Under control of the control block 114, the switching block 108 selectively outputs either L1 or PLP as output data. The output signal from the switching block 108 is forwarded to the LDPC decoder 111.

That is, the output signal from the switching block 108 becomes the input signal to the LDPC decoder 111. In turn, the LDPC decoder 111 performs an LDPC decoding process on the input signal using the transformed parity check matrix generated based on the parity check matrix utilized in the LDPC coding process on the transmitting side (L1 will be discussed later). The data resulting from the LDPC decoding process is sent to the BCH decoder 112. On the transmitting side, the LDPC coding process is performed on PLP by the PLP generation block 12 in FIG. 8, on the pre-signal of L1 by the LDPC encoder 34 in FIG. 9, and on the post-signal of L1 by the LDPC encoder 44 in FIG. 9.

The data output from the LDPC decoder 111 and input to the BCH decoder 112 has undergone the BCH coding process as an error correcting code process on the transmitting side. The BCH decoder 112 thus decodes the data having undergone the BCH coding process and outputs the resulting data to the TS buffer 113 for temporary storage, before outputting the data to the outside. On the transmitting side, the BCH coding process is performed on PLP by the PLP generation block 12 in FIG. 8, on the pre-signal of L1 by the BCH encoder 33 in FIG. 9, and on the post-signal of L1 by the BCH encoder 43 in FIG. 9.

On the basis of the output data from the BCH decoder 112 and other data, the control block 114 controls the operations of the components ranging from the frequency deinterleaver 102 to the switching block 110.

Figure 12:
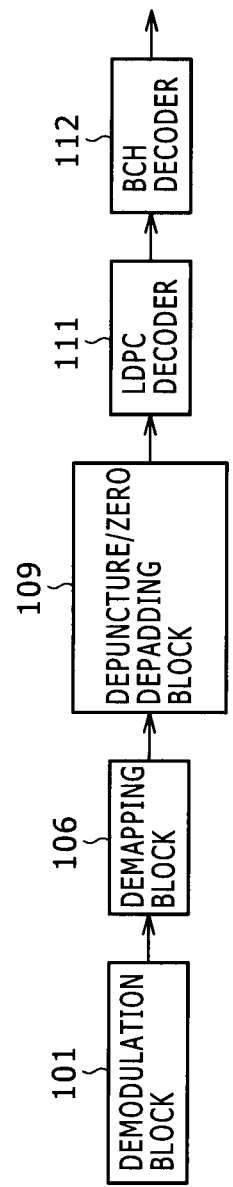
FIG. 12 is a schematic view explanatory of the flow of an L1 pre-signal being decoded.
Figure 13:
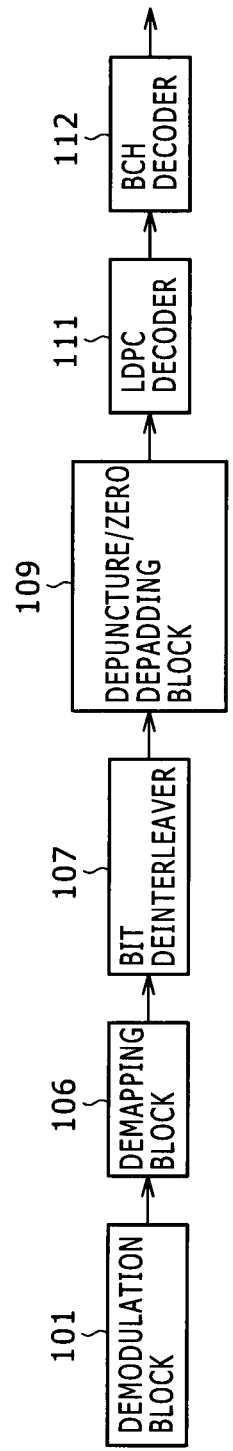
FIG. 13 is a schematic view explanatory of the flow of an L1 post-signal being decoded.

From the point of view of the L1 flow, the components (excluding the switching blocks) of the receiving apparatus in FIG. 11 may be considered interconnected as shown in FIGS. 12 and 13.

FIG. 12 is a schematic view explanatory of the flow of the L1 pre-signal being decoded.

As shown in FIG. 12, the pre-signal of L1 is forwarded successively from the demodulation block 101 to the demapping block 106 to the depuncture/zero depadding block 109 to the LDPC decoder 111 to the BCH decoder 112.

FIG. 13 is a schematic view explanatory of the flow of the L1 post-signal being decoded.

As shown in FIG. 13, the post-signal of L1 is forwarded from the demodulation block 101 to the demapping block 106 to the bit deinterleaver 107 to the depuncture/zero depadding block 109 to the LDPC decoder 111 and to the BCH decoder 112.

Convergence of L1 in LDPC Decoding (Detailed Explanation of the Problem to be Solved by the Invention)

As discussed above, the receiving apparatus whose structure is shown in FIG. 11 performs the LDPC decoding process on code sequences in LDPC codes corresponding to L1.

However, when the LDPC-coded sequence corresponding to L1 is subjected to the LDPC decoding process, decoding convergence has turned out to be slow if the parity check matrix H involved is used as is. If decoding iterations are terminated before such slow convergence, decoding performance can deteriorate.

The first reason for slow decoding convergence is that the LDPC-coded sequence corresponding to L1 has been punctured. Because the information of punctured bits or symbols disappears, the decoding iterations in LDPC codes are slow to converge on code words. With a larger number of iterations needed, longer delays tend to occur in decoding.

The second reason for slow decoding convergence is this: that despite the fact that the padded zeros are known to be zeros (i.e., their probability is 1) even before they are decoded, the padded zeros are subject to needless decoding calculations if the parity check matrix H is used unmodified.

As described, zero padding and puncture effected on the LDPC-coded sequence corresponding to L1 are the principal reasons for slow decoding convergence. What follows is an outline of such zero padding and puncture.

Explanation of Zero Padding and Puncture

Figure 14A:
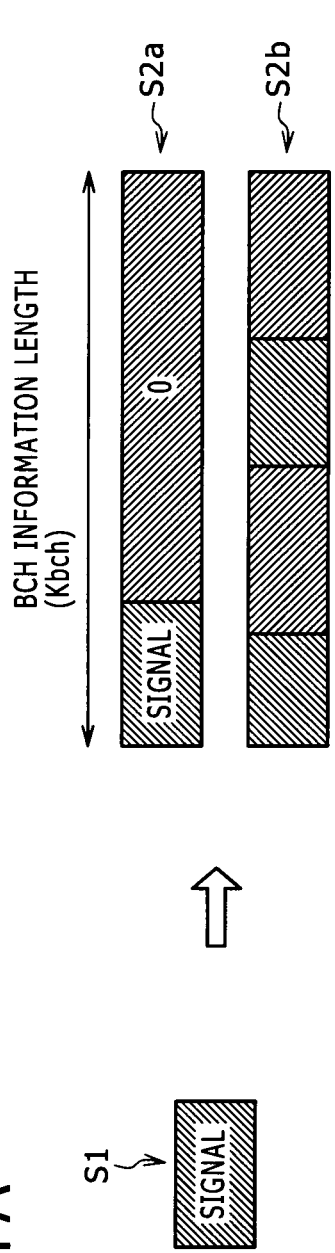
FIGS. 14A and 14B are schematic views explanatory of how zero padding and puncture are illustratively effected.
Figure 14B:
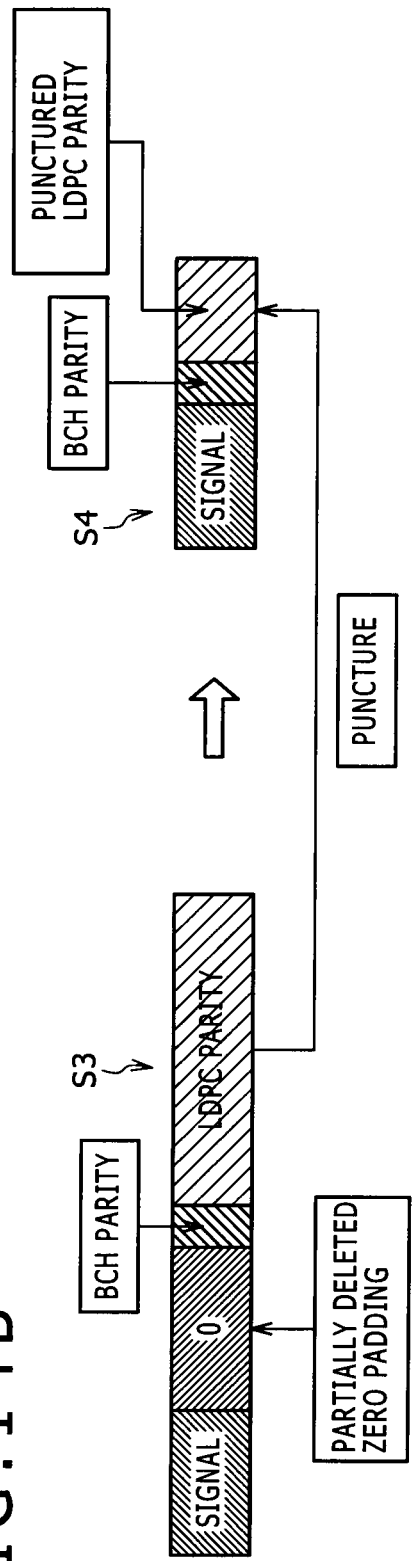

FIGS. 14A and 14B are schematic views explanatory of how zero padding and puncture are typically brought about.

FIG. 14A is explanatory of how zero padding is effected.

In FIG. 14A, a signal S1 (described as "signal" on the left) represents L1 prior to zero padding. In the case of the L1 pre-signal, the output signal from the CRC insertion portion 31 in FIG. 9 corresponds to the signal S1. In the case of the L1 post-signal, the output signal from the CRC insertion portion 41 in FIG. 9 corresponds to the signal S1.

The zero padding portion 32 or 42 in FIG. 9 effects zero padding on the signal S1. Specifically, the zero padding portion 32 or 42 inserts (i.e., pads) zeros of predetermined bits into the signal S1. The padding process brings about either a signal S2$a$ or a signal S2$b$ shown on the right in FIG. 14A. The lightly shaded portions of the signal S2$a$ or S2$b$ represent the portions corresponding to the signal S1. The deeply shaded portions of the signal S2$a$ or S2$b$ denote the portions corresponding to the padded zeros.

FIG. 14B is explanatory of how puncture is effected.

A signal S3 shown on the left in FIG. 14B represents L1 prior to padding. In the case of the L1 pre-signal, the output signal from the LDPC encoder 32 in FIG. 9 corresponds to the signal S3. In the case of the L1 post-signal, the output signal from the LDPC encoder 44 in FIG. 9 corresponds to the signal S3.

The puncturing/zero deletion portion 35 or 45 deletes padded zeros from the output signal S3 coming from the LDPC encoder 34 or 44, thereby puncturing the LDPC parity bits. This process provides a signal S4 shown on the right in FIG. 14B.

FIGS. 15A, 15B and 15C are schematic views explanatory of how puncture is illustratively effected.

As shown in FIG. 15A, the parity interleaving process first divides the parity bits into groups of 360 bits from the beginning.

The number "q" of groups is 36 for the L1 pre-signal and 25 for the L1 post-signal. For purpose of simplification and illustration, the group count "q" is assumed to be three in this example. Specifically, the parity bits are assumed to be divided into a first parity group, a second parity group, and a third parity group in the ensuing description.

More specifically, suppose that as shown in FIG. 15B, the LDPC parity bits are divided into the first parity group containing unenclosed numbers 0 and 1, the second parity group containing numbers 0 and 1 enclosed in a rectangle each, and the third parity group containing numbers 0 and 1 enclosed in a triangle each.

Then the group to be punctured is determined according to the modulation method in use and the signal length in effect. The determined group is removed, whereby parity bit puncture is accomplished.

For example, suppose that the second parity group is determined to be the group to be punctured. In this case, puncture is effected when the second parity group out of the LDPC parity groups in FIG. 15B is deleted. As a result, the punctured parity bits shown in FIG. 15C are obtained as the LDPC parity bits subsequent to the puncturing process in FIG. 14B.

Techniques of the Present Invention

As mentioned above, the major reasons for slow convergence in the decoding of the LDPC-coded sequence corresponding to L1 are that the sequence is subject to zero padding and puncture. The inventors of this invention have thus come up with the following techniques for accelerating convergence in decoding.

One technique is designed to accelerate convergence in decoding while minimizing adverse effects stemming from puncture. The technique involves performing a matrix transform process including a first and a second process on the parity check matrix H noted to have punctured bits or symbols. Performing the first process carries out Galois field addition operations on those rows of the parity check matrix which share non-zero elements with those columns of the parity check matrix which correspond to the punctured bits or symbols in order to set the non-zero elements to zero. Performing the second process deletes the columns rid of the non-zero elements in the first process. In the ensuing description, the technique of executing the matrix transform process including the first and the second processes will be referred to as the punctured parity check matrix reducing technique.

The inventors of the present invention have also invented the technique of deleting the columns corresponding to the zero-padded bits or symbols from the parity check matrix H in order to accelerate convergence in decoding while minimizing adverse effects stemming from zero padding. In the ensuing description, this technique will be referred to as the zero-padded parity check matrix reducing technique.

What follows is an explanation of how the zero-padded parity check matrix reducing technique and punctured parity check matrix reducing technique are illustratively implemented.

Figures 16A, 16B:
FIGS. 16A and 16B are schematic views explanatory of a typical technique for reducing a zero-padded parity check matrix.

FIGS. 16A and 16B are schematic views explanatory of a specific example in which the zero-padded parity check matrix reducing technique is practiced.

The parity check matrix H shown in FIG. 16A is an original parity check matrix H in effect before the zero-padded parity check matrix reducing technique is applied. Reference symbols p0 through p9 placed on top of the columns in the parity check matrix H denote the probability of reception information in each column being zero.

The probability identified by p1 through p3 regarding the reception information is 1.0 as shown in FIG. 16. That is because the probability in question pertains to zero-padded bits or symbols which are fixed to zeros whether they are decoded or not.

According to the zero-padded parity check matrix reducing technique, the columns 2 through 4 corresponding to the zero-padded bits or symbols are deleted from the columns 1 through 10 in the original parity check matrix H of FIG. 16A. This process provides a reduced parity check matrix H shown in FIG. 16B.

FIGS. 17A, 17B, 17C and 17D are schematic views explanatory of a specific example in which the punctured parity check matrix reducing technique is practiced.

The parity check matrix H shown in FIG. 17A is an original parity check matrix H in effect before the punctured parity check matrix reducing technique is applied. That is, the parity check matrix H shown in FIG. 17A is the same as the parity check matrix H in FIG. 16A. Thus as in FIG. 16A, reference symbols p0 through p9 on top of the columns in the parity check matrix H shown in FIG. 17A denote the probability of reception information in each column being zero.

It should be noted that in FIG. 17A, the probability identified by p7 for reception information is 0.5. That is, the reception information corresponding to the probability identified by p7 corresponds to punctured bits or symbols in the example of FIG. 17A. That means the information is not actually received and is not yet known to be either "0" or "1." Hence the probability identified by p7 is 0.5.

In this example, the column 8 out of the columns 1 through 10 in the parity check matrix H of FIG. 17A is the column corresponding to punctured bits or symbols. Thus the column 8 in the parity check matrix H of FIG. 17A is noted for eventual deletion.

In the noted column 8 of the parity check matrix H in FIG. 17A, non-zero elements are "1" in row 3, column 8 and "1" in row 4, column 8. Because of the presence of these non-zero elements, it becomes necessary during LDPC decoding to use the probability of p7 originally set to 0.5 for lack of information. This causes a delay of convergence in decoding. Where the punctured parity check matrix reducing technique is utilized, the non-zero elements are removed. This in turn makes it possible to perform LDPC decoding without using the probability of p7 originally set to 0.5 for lack of information. As a result, the convergence in decoding is accelerated.

According to the punctured parity check matrix reducing technique, as shown in FIG. 17B, the first process is effected to carry out Galois field addition operations on the rows (row 3 and row 4) sharing non-zero elements with the noted columns (column 8). As a result, the non-zero element in the noted columns (column 8) becomes zero (in row 3, column 8) as shown in FIG. 17C.

In the second process, the column (column 8) rid of its non-zero element during the first process is deleted. This process provides a reduced parity check matrix H as shown in FIG. 17D.

In the foregoing paragraphs, the zero-padded parity check matrix reducing technique and the punctured parity check matrix reducing technique were discussed separately for independent uses. Alternatively, these techniques may be practiced in combination.

FIG. 18 schematically shows a parity check matrix H obtained through the combination of the zero-padded parity check matrix reducing technique and the punctured parity check matrix reducing technique applied to the parity check matrix H in FIG. 16A (as in FIG. 17A).

As shown in FIG. 18, a further reduced parity check matrix H is acquired if the zero-padded parity check matrix reducing technique and the punctured parity check matrix reducing technique are used in combination.

FIGS. 19A and 19B are typical Tanner graphs explanatory of a process that combines the zero-padded parity check matrix reducing technique with the punctured parity check matrix reducing technique.

FIG. 19A shows a Tanner graph in effect when the parity check matrix H of FIG. 16A (as in FIG. 17A) is used as is.

FIG. 19B shows a Tanner graph involving the use of a parity check matrix H obtained through the combination of the zero-padded parity check matrix reducing technique and the punctured parity check matrix reducing technique applied to the parity check matrix H in FIG. 16A (as in FIG. 17A).

In FIGS. 19A and 19B, the nodes shown at the top and enclosed in a circle each denote variable nodes, and the nodes shown at the bottom and enclosed in a rectangle each represent check nodes.

For purpose of illustration and for a better understanding of the zero-padded parity check matrix reducing technique and the punctured parity check matrix reducing technique, the foregoing description has employed parity check matrices H smaller than those actually used. Obviously, these inventive techniques can be applied just as effectively to larger parity check matrices for actual use.

FIGS. 20 through 25 show results of the process which combines the zero-padded parity check matrix reducing technique with the punctured parity check matrix reducing technique and which is performed on parity check matrices of actual sizes.

Figure 20:
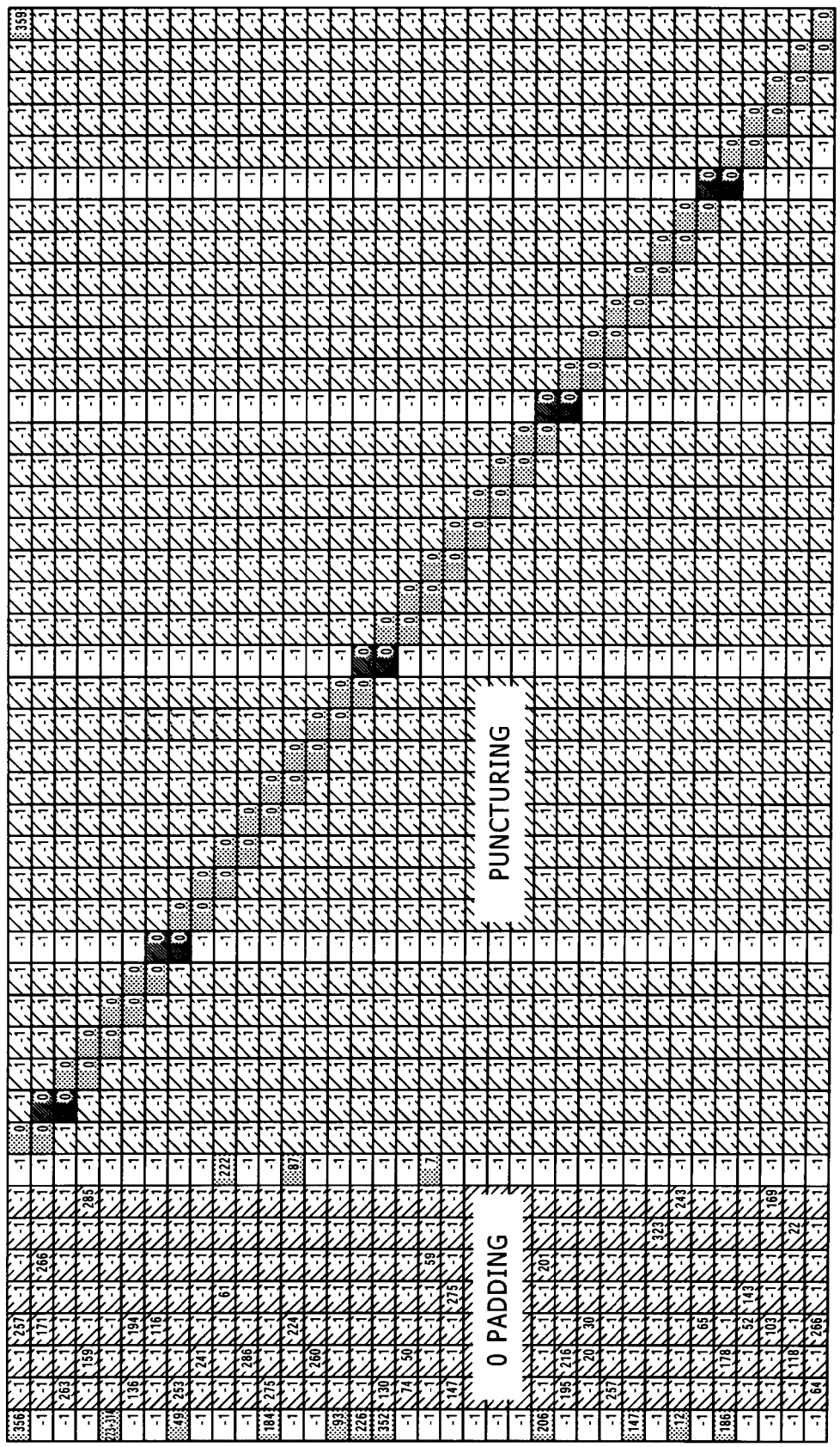
FIG. 20 is a schematic view showing a parity check matrix of an actual size subject to the process that combines the zero-padded parity check matrix reducing technique with the punctured parity check matrix reducing technique.

FIG. 20 schematically shows an original parity check matrix H in effect before the zero-padded parity check matrix reducing technique and the punctured parity check matrix reducing technique are applied.

In FIG. 20, the portion identified by "0 padding" denotes columns corresponding to zero-padded bits or symbols, and the portion identified by "Puncturing" represent punctured bits or symbols.

In FIG. 20, the rectangles (with numbers therein) making up the parity check matrix H represent a square matrix of 360 rows by 360 columns.

FIGS. 21A, 21B, 21C and 21D are explanatory of the significance of the numbers in the rectangles forming the parity check matrix H of FIG. 20.

The number in each of the rectangles constituting the parity check matrix H of FIG. 20 is the value by which the rectangle in question is right shifted relative to the unit matrix shown in FIG. 21A. For example, if "1" is found in a given rectangle, that rectangle denotes the matrix obtained by right shifting the unit matrix in FIG. 21A by "1," i.e., the matrix shown in FIG. 21B.

As an exception, if a rectangle as part of the parity check matrix H in FIG. 20 contains "−1," that rectangle denotes a zero matrix. If the number in a given rectangle has a prime (') attached thereto, that rectangle represents the matrix obtained by right shifting the unit matrix in FIG. 21A by the primed number, minus the non-zero elements in row 1 of the matrix. Illustratively, if a given rectangle constituting part of the parity check matrix H in FIG. 20 contains "359'," that rectangle denotes the matrix acquired by right shifting the unit matrix in FIG. 21A by 359 (i.e., matrix in FIG. 21C), minus the non-zero elements in row 1 of the matrix (i.e., matrix in FIG. 21D).

Furthermore, if a rectangle in the parity check matrix H of FIG. 20 contains two numbers with the symbol "+" therebetween, that rectangle represents the sum of two matrices, one matrix obtained by right shifting the unit matrix in FIG. 21A by the first number (before the symbol "+"), the other matrix acquired by right shifting the same unit matrix by the second number (after the symbol "+"). For example, if a given rectangle constituting part of the parity check matrix H in FIG. 20 contains "223+314," that rectangle denotes the sum of two matrices, one matrix obtained by right shifting the unit matrix in FIG. 21A by 223, the other matrix acquired by right shifting the same unit matrix by 314.

The foregoing explanation also applies to the parity check matrices to be discussed below with reference to FIGS. 22 through 25.

Figure 22:
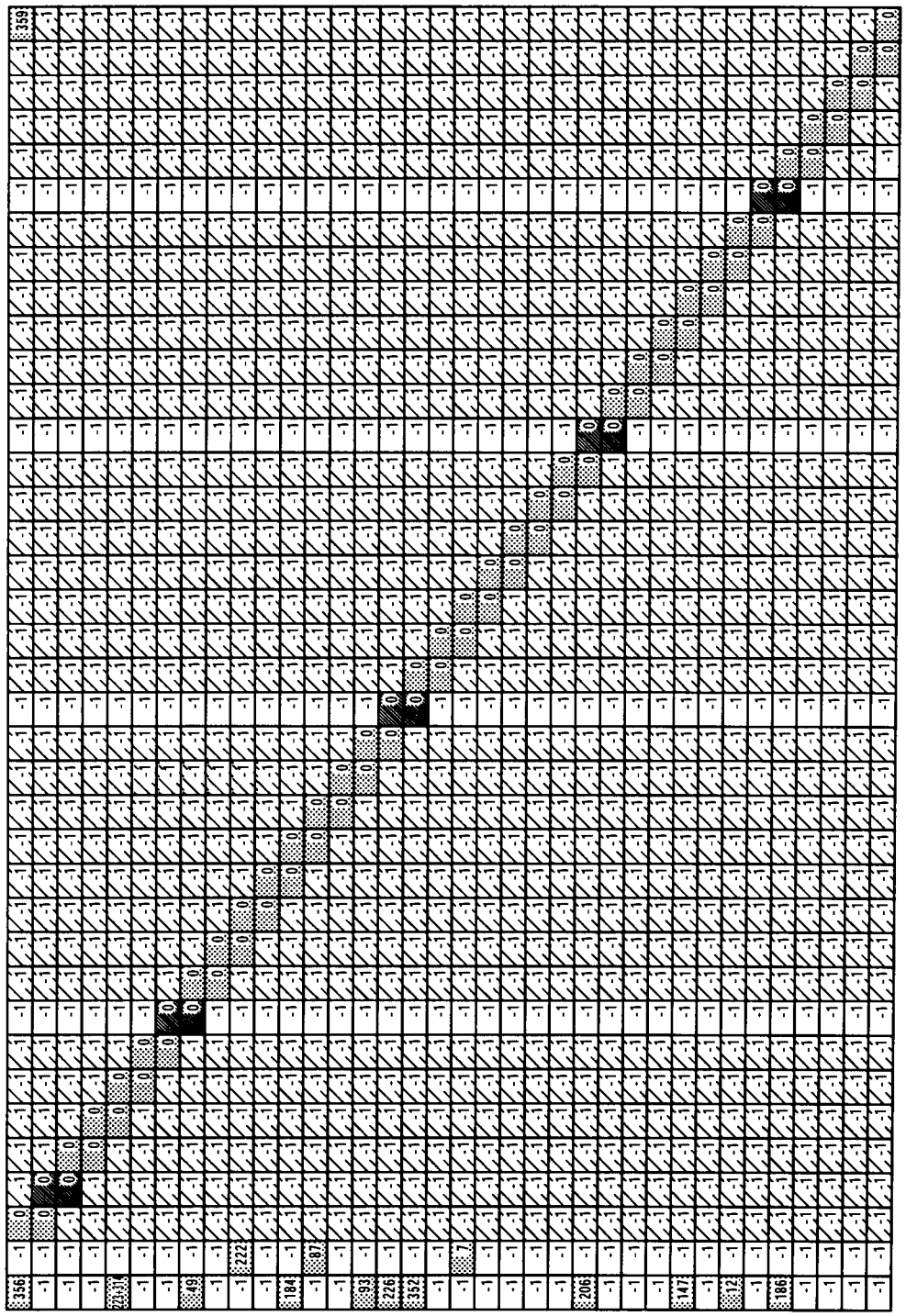
FIG. 22 is a schematic view showing other results of the process which combines the zero-padded parity check matrix reducing technique with the punctured parity check matrix reducing technique and which is performed on the parity check matrix of the actual size.

FIG. 22 schematically shows a parity check matrix H obtained by performing the process according to the zero-padded parity check matrix reducing technique on the parity check matrix H in FIG. 20.

Figure 23:
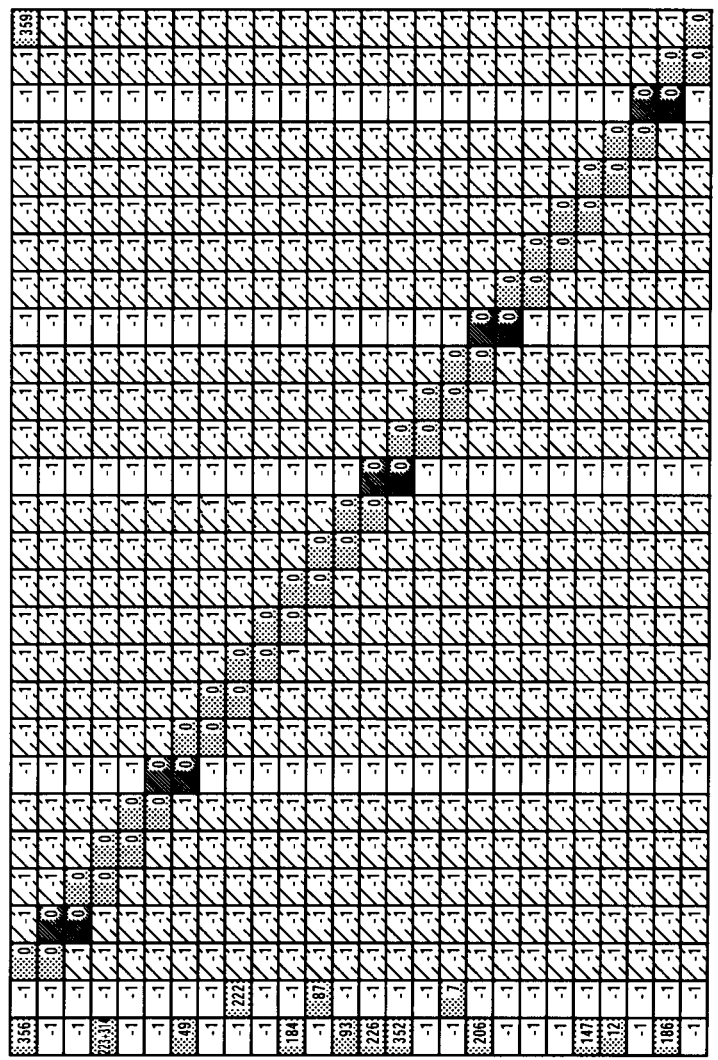
FIG. 23 is a schematic view showing other results of the process which combines the zero-padded parity check matrix reducing technique with the punctured parity check matrix reducing technique and which is performed on the parity check matrix of the actual size.

FIG. 23 schematically shows a parity check matrix H obtained by performing the process according to the punctured parity check matrix reducing technique on the parity check matrix H in FIG. 22.

Figure 24:
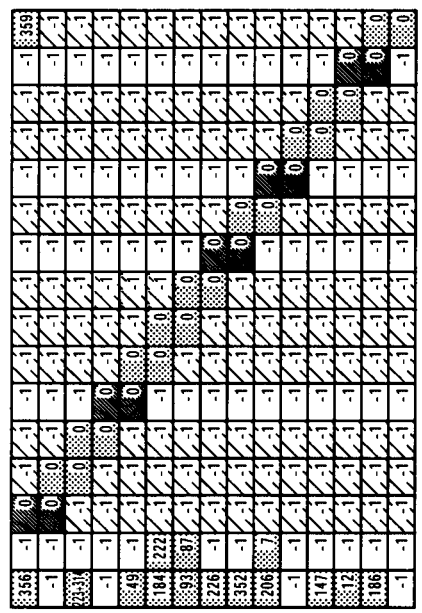
FIG. 24 is a schematic view showing other results of the process which combines the zero-padded parity check matrix reducing technique with the punctured parity check matrix reducing technique and which is performed on the parity check matrix of the actual size.

FIG. 24 schematically shows a parity check matrix H obtained by performing the process according to the punctured parity check matrix reducing technique on the parity check matrix H in FIG. 23.

FIG. 25 schematically shows a parity check matrix H obtained by performing the process according to the punctured parity check matrix reducing technique on the parity check matrix H in FIG. 24.

In the examples shown in FIGS. 20 through 25, the columns corresponding to the zero-padded bits or symbols are first deleted by the zero-padded parity check matrix reducing technique (see FIG. 21). Then Galois field addition operations are carried out recursively on the rows (row 3 and row 4) sharing non-zero elements with the noted columns (column 8) in accordance with the punctured parity check matrix reducing technique (see FIGS. 22 through 25). As a result (but not definitively), the parity check matrix H shown in FIG. 25 is acquired as one appreciably reduced from what is indicated in FIG. 20.

The zero-padded parity check matrix reducing technique and punctured parity check matrix reducing technique explained above can be applied to the parity check matrix H of L1. These techniques may be further applied advantageously to the parity check matrix H of the pre-signal out of L1 as shown in FIG. 26.

Figure 26:
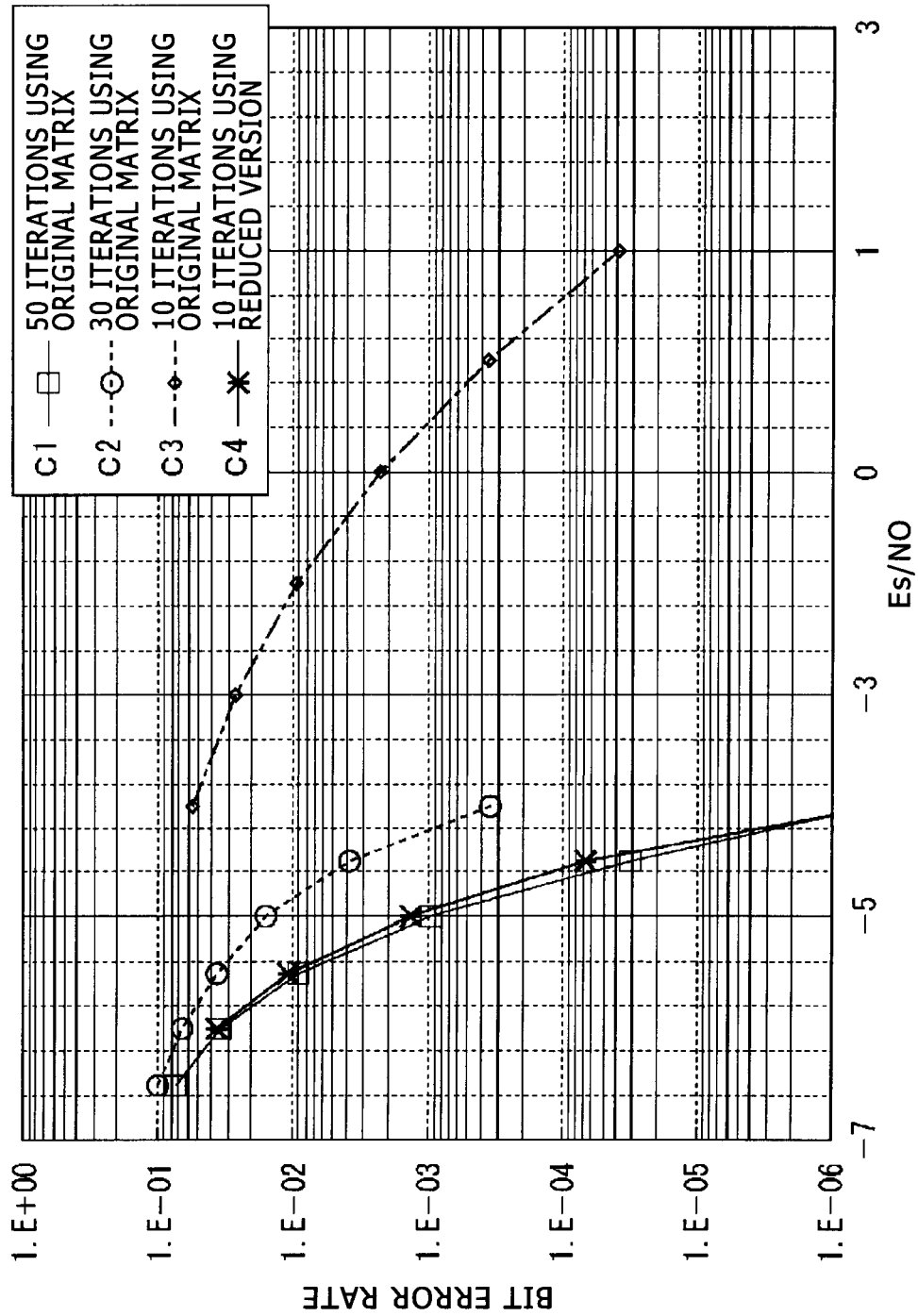
FIG. 26 is a graphic representation showing how an L1 pre-signal parity check matrix is effectively reduced using the zero-padded parity check matrix reducing technique and the punctured parity check matrix reducing technique.

FIG. 26 is a graphic representation showing how an L1 pre-signal parity check matrix is effectively reduced using the zero-padded parity check matrix reducing technique and the punctured parity check matrix reducing technique.

In FIG. 26, the horizontal axis stands for Es/NO and the vertical axis for bit error rates.

In an explanation of FIG. 26 and for purpose of simplification and illustration, the parity check matrix H in effect before the zero-padded parity check matrix reducing technique and the punctured parity check matrix reducing technique are applied will be referred to as the original matrix in keeping with the description of FIG. 26. As opposed to the original matrix, the parity check matrix H obtained through the process that combines the zero-padded parity check matrix reducing technique with the punctured parity check matrix reducing technique will be referred to as the reduced version.

In LDPC decoding, the decoding process repeated as many as "Iter" times ("Iter" denotes a positive integer) will be referred to as N iterations.

In FIG. 26, a curve C1 represents the characteristic in effect when 50 iterations have been performed using the original matrix. A curve C2 denotes the characteristic in effect when 30 iterations have been carried out using the original matrix. A curve C3 stands for the characteristic in effect when 10 iterations have been effected using the original matrix. A curve C4 indicates the characteristic in effect when 10 iterations have been performed using the reduced version.

In the order of the curves C1, C2, and C3 are shown to the left of FIG. 26. LDPC decoding performance is higher the more to the left the characteristic curve appears in FIG. 26. That means the larger the number of iterations performed, the higher the level of LDPC decoding performance attained.

It should be noted here that the curve C1 substantially coincides with the curve C4. This means that the degree of LDPC decoding performance reached after 50 iterations using the original matrix can be achieved by as few as 10 iterations using the reduced version. That is, the reduced version permits enhanced LDPC decoding performance with far fewer iterations than the original matrix. In other words, using the reduced version provides significantly faster convergence in the decoding of the LDPC-coded sequence corresponding to L1 (pre-signal in particular) than utilizing the original matrix.

To sum up, the punctured parity check matrix reducing technique may be applied to the LDPC decoding process performed on the LDPC codes of which the code sequence has been punctured.

The zero-padded parity check matrix reducing technique may be applied to the LDPC decoding process carried out on the LDPC-coded sequence that includes padded zeros.

If the LDPC codes targeted to be decoded constitute a code sequence that has been punctured and if the LDPC-coded sequence includes padded zeros, then the punctured parity check matrix reducing technique and the zero-padded parity check matrix reducing technique may be used in combination. In this case, even if the padded zero are found to have been punctured from code words, the parity check matrix H may be transformed into a matrix rid of the columns corresponding to the padded zeros, whereby LDPC decoding is carried out.

Where the punctured parity check matrix reducing technique and zero-padded parity check matrix reducing technique are in use, it is possible to either maintain or change the girth of the original parity check matrix H. With these techniques, it is also possible to either maintain or change a minimum number of loops of the original parity check matrix H.

If the above-described LDPC codes are bit-interleaved when transmitted, it is possible to perform zero depadding and depuncture processes suitably on a parity check matrix H acquired through the matrix transform process carried out using the punctured parity check matrix reducing technique and zero-padded parity check matrix reducing technique.

During the matrix transform process carried out by use of the punctured parity check matrix reducing technique and zero-padded parity check matrix reducing technique, it is preferred, but not required, to inhibit the process of deleting parallel processing units and the process of row transform for LDPC decoding.

When the above-described punctured parity check matrix reducing technique and zero-padded parity check matrix reducing technique are applied, the following three major benefits are provided.

As the first benefit, a parity check matrix H smaller than the ordinary parity check matrix H may be used for LDPC decoding. This makes it possible to reduce the amount of the memory to be retained during the processing.

As the second benefit, the availability of the parity check matrix H smaller than the ordinary parity check matrix H for LDPC decoding makes it possible to reduce the amount of calculations per decoding iteration and thereby shorten delays of the LDPC decoding process.

The third benefit is as follows: heretofore, when a punctured LDPC-coded sequence was decoded using the ordinary parity check matrix H, the information of the punctured bits or symbols disappeared. The decoding iterations were thus slow to converge so that a large number of iterations were needed to attain convergence. By contrast, where the punctured parity check matrix reducing technique is employed, the columns corresponding to the punctured bits or symbols are deleted. With the parity check matrix H thus reduced, convergence on correct code words is accelerated using fewer iterations (see FIG. 26) than if the ordinary parity check matrix H is utilized.

Structure of the Receiving System

Figure 27:
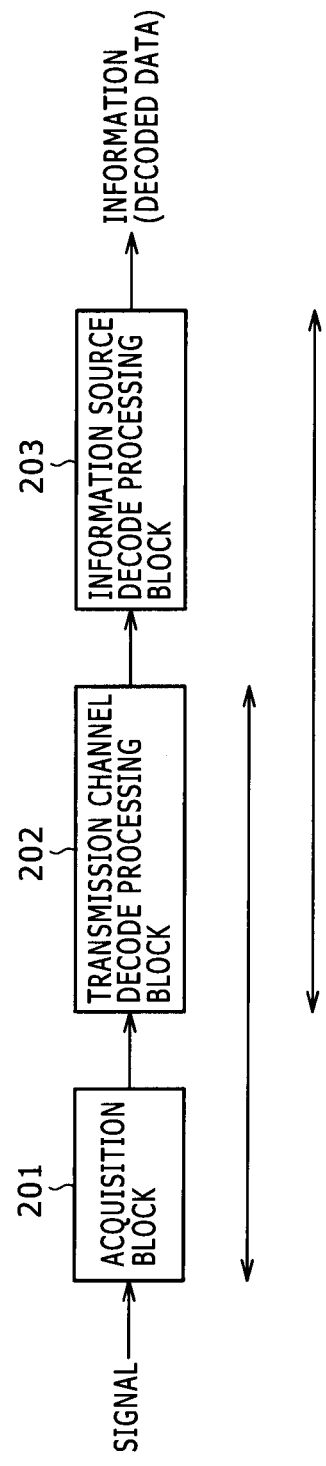
FIG. 27 is a block diagram showing a first structure of a receiving system applicable to the receiving apparatus with its structure shown in FIG. 11.

FIG. 27 is a block diagram showing a first structure of the receiving system applicable to the receiving apparatus with its structure shown in FIG. 11.

In FIG. 27, the receiving system is made up of an acquisition block 201, a transmission channel decode processing block 202, and an information source decode processing block 203.

The acquisition block 201 acquires target data such as video and audio data of broadcast programs in the form of signals including LDPC codes obtained at least through LDPC coding. Illustratively, the acquisition block 201 acquires signals over such transmission channels as terrestrial digital broadcasts, satellite digital broadcasts, CATV (cable television) networks, and other networks including the Internet, not shown. The acquired signal is forwarded to the transmission channel decode processing block 202.

Where the signal to be acquired by the acquisition block 201 is transmitted from broadcasting stations using terrestrial broadcast waves, satellite broadcast waves or a CATV network, the acquisition block 201 is typically constituted by a tuner or a set-top box (STB). Where the signal to be acquired by the acquisition block 201 is transmitted on a multicast basis illustratively from Web servers as IPTV (Internet Protocol Television), the acquisition block 201 is typically composed of a network interface (I/F) such as a network interface card (NIC).

Upon receipt of the signal acquired by the acquisition block 201 over the transmission channel, the transmission channel decode processing block 202 performs on the received signal a transmission channel decoding process including at least the process of correcting errors that may have occurred along the transmission channel. The signal resulting from the process is fed to the information source decode processing block 203.

The signal acquired by the acquisition block 201 over the transmission channel has at least undergone processing involving error-correcting codes for correcting errors having occurred along the channel. Thus the transmission channel decode processing block 202 performs on that signal the transmission channel decoding process including corresponding error-correcting code processing.

The error-correcting code processing typically includes LDPC coding and Reed-Solomon coding. With this embodiment, at least LDPC coding is assumed to be carried out.

The transmission channel decoding process may include demodulation of modulated signals.

The information source decode processing block 203 performs on the signal having undergone the transmission channel decoding process an information source decoding process including at least the process of expanding compressed information back to the original information.

That is, the signal acquired by the acquisition block 201 over the transmission channel may have been compression-encoded whereby the amount of data such as pictures and sounds is reduced for use as the information of interest. In such a case, the information source decode processing block 203 carries out on the signal having undergone the transmission channel decoding process the information source decoding process such as the process of putting the compressed information back to the original information (i.e., expanding process).

If the signal obtained by the acquisition block 201 over the transmission channel has not undergone compression encoding, then the information source decode processing block 203 does not perform the process of expanding the compressed information to the original information.

The expanding process illustratively includes MPEG decoding. In addition to the expanding process, the information source decoding process may include descrambling.

In the receiving system structured as described above, the acquisition block 201 acquires over the transmission channel the signal formed by data such as pictures and sounds compression-encoded illustratively in the MPEG format and having undergone error-correcting code processing illustratively in LDPC codes. The acquired signal is forwarded to the transmission channel decode processing block 202.

Upon receipt of the signal from the acquisition block 201, the transmission channel decode processing block 202 carries out on the received signal the same process performed by the components ranging from the demodulation block 101 to the BCH decoder 112, as the transmission channel decoding process. The signal obtained through the transmission channel decoding process is fed to the information source decode processing block 203.

Given the signal from the transmission channel decode processing block 202, the information source decode processing block 203 carries out the information source decoding process such as MPEG decoding on the received signal. The transmission channel decode processing block 202 then outputs the pictures and/or sounds resulting from the process.

The above-described receiving system in FIG. 27 may be applied illustratively to TV tuners for receiving digital TV broadcasts, among others.

The acquisition block 201, transmission channel decode processing block 202, and information source decode processing block 203 may each be constituted either as an independent hardware device (e.g., integrated circuit (IC)) or as a software module.

At least two of the acquisition block 201, transmission channel decode processing block 202, and information source decode processing block 203 may be structured as an independent set of equipment. Such a set may be formed illustratively by the acquisition block 201 and transmission channel decode processing block 202. Another typical set may be constituted by the transmission channel decode processing block 202 and information source decode processing block 203. Yet another typical set may be composed of the acquisition block 201, transmission channel decode processing block 202, and information source decode processing block 203.

Figure 28:
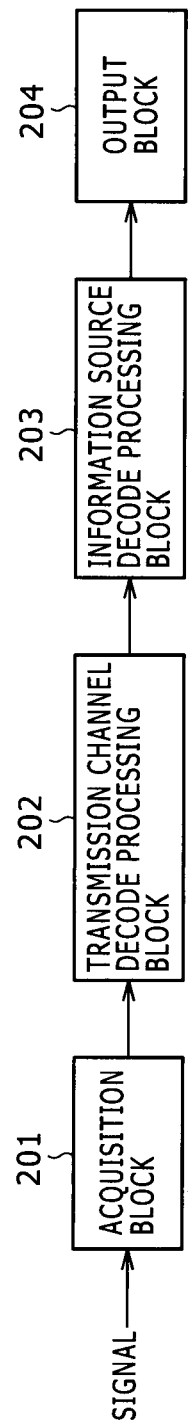
FIG. 28 is a block diagram showing a second structure of the receiving system applicable to the receiving apparatus with its structure shown in FIG. 11.

FIG. 28 is a block diagram showing a second structure of the receiving system applicable to the receiving apparatus with its structure shown in FIG. 11.

In FIG. 28, the components corresponding to those shown in FIG. 27 are designated by like reference numerals, and their description will be omitted hereunder where appropriate.

The receiving system of FIG. 28 is the same as its counterpart of FIG. 27 in that it includes the acquisition block 201, transmission channel decode processing block 202, and information source decode processing block 203. What makes the receiving system in FIG. 28 different from the system in FIG. 27 is the presence of an output block 204 that is added anew.

The output block 204 may be constituted illustratively by a display device for displaying pictures and/or by speakers for outputting sounds. As such, the output block 204 outputs the pictures and sounds formed by the signal output from the information source decode processing block 203. The output block 204 is thus configured to display pictures and/or to output sounds.

The above-described receiving system in FIG. 28 may be applied illustratively to TV sets for receiving digital TV broadcasts or to radio sets for receiving radio broadcasts.

If the signal acquired by the acquisition block 201 has not undergone compression encoding, then the signal output from the transmission channel decode processing block 202 is supplied directly to the output block 204.

Figure 29:
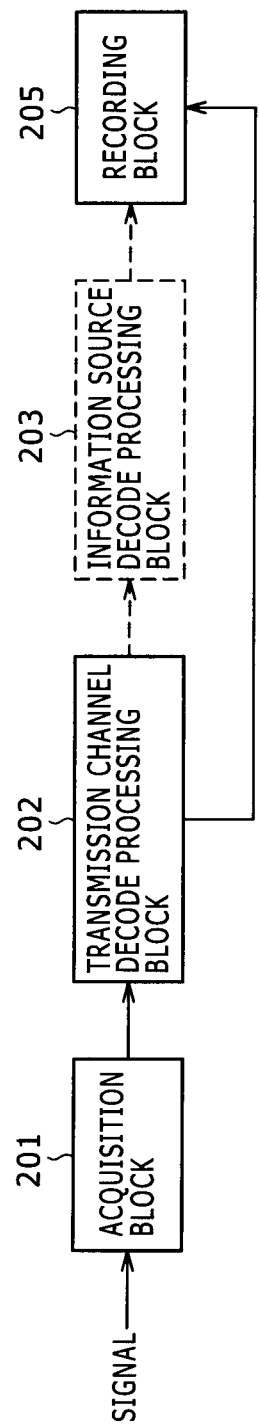
FIG. 29 is a block diagram showing a third structure of the receiving system applicable to the receiving apparatus with its structure shown in FIG. 11.

FIG. 29 is a block diagram showing a third structure of the receiving system applicable to the receiving apparatus whose structure is shown in FIG. 11.

In FIG. 29, the components corresponding to those shown in FIG. 27 are designated by like reference numerals, and their description will be omitted hereunder where appropriate.

The receiving system of FIG. 29 is the same as its counterpart of FIG. 28 in that it includes the acquisition block 201 and transmission channel decode processing block 202.

What makes the receiving system in FIG. 29 different from the system in FIG. 28 is the absence of the information source decode processing block 203 and the presence of a recording block 205 that is added anew.

The recording block 205 records signals output from the transmission channel decode processing block 202 (e.g., TS packets of TS in the MPEG format) to recording media such as a hard disk (magnetic disk) or a flash memory.

The above-described receiving system in FIG. 29 may be applied illustratively to recorders for recording TV broadcasts.

In FIG. 29, the receiving system may be furnished with the information source decode processing block 203 that performs the information source decoding process on the supplied signal. The resulting signal made up of decoded pictures and sounds may then be recorded by the recording block 205.

The present invention may also be applied to receiving apparatuses or receiving systems capable of receiving the L1 part 2 under DVB-C.2. Like L1, the L1 part 2 is an LDPC-coded sequence including padded zeros that have been punctured at least partially. Details of the L1 part 2 are discussed in "DVB BlueBook, Frame structure channel coding and modulation for a second generation digital transmission system for cable system (DVB-C2)" at the DVB website updated on April, 2009 (accessed on May 28, 2009 on the Internet <URL: http://www.dvb.org/technology/standards/a138.dvb-c2.den302769v111.pdf>; called the reference material hereunder). The descriptions in the reference material particularly in connection with FIG. 21 reveal how zero padding and puncture are effected on the L1 part 2.

Application of the Present Invention to Programs

The series of the processes described above may be executed either by hardware or by software.

Where software is adopted for process execution, a computer such as one shown in FIG. 30 may be used at least as part of the receiving system including the above-described receiving apparatus.

In FIG. 30, a CPU (central processing unit) 301 performs various processes according to the programs recorded on a ROM (read only memory) 302 or in accordance with the programs loaded from a recording block 308 into a RAM (random access memory) 303. The RAM 303 also accommodates data that may be needed by the CPU 301 in carrying out its diverse processing.

The CPU 301, ROM 302, and RAM 303 are interconnected by a bus 304. An input/output interface 305 is also connected to the bus 304.

The input/output interface 305 is connected with an input block 306 typically made of a keyboard and a mouse, and an output block 307 formed illustratively by a display device. Also connected to the input/output interface 305 are the recording block 308 typically composed of a hard disk and a communication block 309 constituted illustratively by a modem or a terminal adapter. The communication block 309 controls communications conducted with other apparatuses (not shown) over networks including the Internet.

A drive 310 may be connected as needed to the input/output interface 305. A piece of removable media 311 such as magnetic disks, optical disks, magneto-optical disks or semiconductor memories may be loaded into the drive 310. Computer programs may then be retrieved from the removable medium loaded in the drive 310 and installed into the recording block 308 as needed.

Where the series of the processes above are to be executed by software, the programs constituting the software may be either retrieved from dedicated hardware of the computer in use or installed via networks or from a suitable recording medium into a general-purpose computer or like equipment capable of executing diverse functions based on the installed programs.

As shown in FIG. 30, the recording media that hold these programs are distributed to users not only as the removable media (package media) 311 apart from their apparatuses and constituted by magnetic disks (including floppy disks), optical disks (including CD-ROM (compact disk-read only memory) and DVD (digital versatile disk)), magneto-optical disks (including MD (Mini-disk)), or semiconductor memories, the media carrying the programs offered to the users; but also in the form of the ROM 302 or the hard disk drive in the recording block 308, the media accommodating the programs and incorporated beforehand in the users' apparatuses.

In this specification, the steps describing the programs stored on the recording media represent not only the processes that are to be carried out in the depicted sequence (i.e., on a time series basis) but also processes that may be performed parallelly or individually and not chronologically.

In this specification, the term "system" refers to an entire configuration made up of a plurality of component devices and processing elements.

The present application contains subject matter related to that disclosed in Japanese Priority Patent Application JP 2009-131256 filed in the Japan Patent Office on May 29, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A receiving apparatus comprising:
reception means for receiving a code sequence coded in low density parity check and punctured at least partially as a target to be decoded; and
low density parity check decoding means for performing a punctured matrix transform process including a first and a second process on an original parity check matrix noted to have punctured bits or symbols and used in the low density parity check coding, said low density parity check decoding means further performing said first process to carry out Galois field addition operations on those rows of said original parity check matrix which share non-zero elements with those columns of said original parity check matrix which correspond to said punctured bits or symbols in order to set said non-zero elements to zero, said low density parity check decoding means further performing said second process to delete the columns rid of said non-zero elements in said first process, said low density parity check decoding means further using the matrix resulting from said punctured matrix transform process as the parity check matrix for performing a low density parity check decoding process on said code sequence received by said reception means.

2. The receiving apparatus according to claim 1, wherein said code sequence received by said reception means includes a zero-padded code sequence coded in low density parity check, and
in addition to said punctured matrix transform process, said low density parity check decoding means performs a zero-padded matrix transform process to delete the columns corresponding to zero-padded bits or symbols on said original parity check matrix, said low density parity check decoding means further using the matrix resulting from said punctured matrix transform process and said zero-padded matrix transform process as the parity check matrix for performing the low density parity check decoding process on said code sequence received by said reception means.

3. The receiving apparatus according to claim 2, wherein said code sequence received by said reception means includes code words having punctured zeros inserted through zero padding, and
as part of said zero-padded matrix transform process, said low density parity check decoding means transforms said original parity check matrix into a matrix rid of the columns corresponding to the padded zeros.

4. The receiving apparatus according to claim 2, wherein said low density parity check decoding means maintains the girth of said original parity check matrix in at least either said punctured matrix transform process or said zero-padded matrix transform process.

5. The receiving apparatus according to claim 2, wherein said low density parity check decoding means changes the girth of said original parity check matrix in at least either said punctured matrix transform process or said zero-padded matrix transform process.

6. The receiving apparatus according to claim 2, wherein said low density parity check decoding means maintains a minimum number of loops of said original parity check matrix in at least either said punctured matrix transform process or said zero-padded matrix transform process.

7. The receiving apparatus according to claim 2, wherein said low density parity check decoding means changes a minimum number of loops of said original parity check matrix in at least either said punctured matrix transform process or said zero-padded matrix transform process.

8. The receiving apparatus according to claim 2, wherein said code sequence received by said reception means is bit-interleaved, and
said receiving apparatus further includes depuncture/zero depadding means for performing a depuncture and zero depadding process suitable for the matrix resulting from said punctured matrix transform process and said zero-padded matrix transform process.

9. The receiving apparatus according to claim 2, wherein said receiver apparatus complies with DVB (Digital Video Broadcasting)-T.2, and
said code sequence received by said reception means includes at least a pre-signal from among the L1 signals stipulated by said DVB-T.2.

10. The receiving apparatus according to claim 9, wherein said code sequence received by said reception means further includes a post-signal from among said L1 signals.

11. The receiving apparatus according to claim 2, wherein said receiver apparatus complies with DVB (Digital Video Broadcasting)-C.2, and
said code sequence received by said reception means includes an L1 part-2 signal stipulated by said DVB-C.2.

12. The receiving apparatus according to claim 2, wherein said low density parity check decoding means inhibits the process of deleting parallel processing units and the process of row transform for low density parity check decoding in said punctured matrix transform process and said zero-padded matrix transform process.

13. The receiving apparatus according to claim 2, wherein said low density parity check decoding means does not inhibit the process of deleting parallel processing units and the process of row transform for low density parity check decoding in said punctured matrix transform process and said zero-padded matrix transform process.

14. A receiving method for use with a receiving apparatus including reception means for receiving a code sequence coded in low density parity check and punctured at least partially as a target to be decoded, said receiving method comprising the steps of:
performing a punctured matrix transform process including a first and a second process on an original parity check matrix noted to have punctured bits or symbols and used in the low density parity check coding;
performing said first process to carry out Galois field addition operations on those rows of said original parity check matrix which share non-zero elements with those columns of said original parity check matrix which correspond to said punctured bits or symbols in order to set said non-zero elements to zero;
performing said second process to delete the columns rid of said non-zero elements in said first process; and
using the matrix resulting from said punctured matrix transform process as the parity check matrix for performing a low density parity check decoding process on said code sequence received by said reception means.

15. A program for use on a computer which controls a receiving apparatus including reception means for receiving a code sequence coded in low density parity check and punctured at least partially as a target to be decoded, said program causing said computer to execute a control process comprising the steps of:
performing a punctured matrix transform process including a first and a second process on an original parity check matrix noted to have punctured bits or symbols and used in the low density parity check coding;
performing said first process to carry out Galois field addition operations on those rows of said original parity check matrix which share non-zero elements with those columns of said original parity check matrix which correspond to said punctured bits or symbols in order to set said non-zero elements to zero;

performing said second process to delete the columns rid of said non-zero elements in said first process; and using the matrix resulting from said punctured matrix transform process as the parity check matrix for performing a low density parity check decoding process on said code sequence received by said reception means.

16. A receiving system comprising:

acquisition means for acquiring over a transmission channel a signal including a code sequence coded in low density parity check (Low Density Parity Check) and punctured at least partially;

transmission channel decoding means for performing a transmission channel decoding process on said signal acquired by said acquisition means over said transmission channel, said transmission channel decoding process including a process of correcting errors that may have occurred in said signal along said transmission channel, thereby obtaining and outputting an error-corrected signal; and either information source decoding means for performing an information source decoding process on the output signal from said transmission channel decoding means, or recording means for recording said output signal from said transmission channel coding device to a recording medium;

said transmission channel decoding means including
low density parity check decoding means for performing a punctured matrix transform process including a first and a second process on an original parity check matrix noted to have punctured bits or symbols and used in the low density parity check coding, said low density parity check decoding means further performing said first process to carry out Galois field addition operations on those rows of said original parity check matrix which share non-zero elements with those columns of said original parity check matrix which correspond to said punctured bits or symbols in order to set said non-zero elements to zero, said low density parity check decoding means further performing said second process to delete the columns rid of said non-zero elements in said first process, said low density parity check decoding means further using the matrix resulting from said punctured matrix transform process as the parity check matrix for performing a low density parity check decoding process on said code sequence acquired by said acquisition means.

17. A receiving apparatus comprising:

a reception device configured to receive a code sequence coded in low density parity check and punctured at least partially as a target to be decoded; and a low density parity check decoding device configured to perform a punctured matrix transform process including a first and a second process on an original parity check matrix noted to have punctured bits or symbols and used in the low density parity check coding, said low density parity check decoding device further performing said first process to carry out Galois field addition operations on those rows of said original parity check matrix which share non-zero elements with those columns of said original parity check matrix which correspond to said punctured bits or symbols in order to set said non-zero elements to zero, said low density parity check decoding device further performing said second process to delete the columns rid of said non-zero elements in said first process, said low density parity check decoding device further using the matrix resulting from said punctured matrix transform process as the parity check matrix for performing a low density parity check decoding process on said code sequence received by said reception device.

* * * * *